United States Patent

Takahashi et al.

[11] Patent Number: 5,319,846
[45] Date of Patent: Jun. 14, 1994

[54] ELECTRONIC COMPONENT FEED SYSTEM

[75] Inventors: Tetsuo Takahashi, Akita; Shinichi Araya, Honjou; Kunio Mogi, Akita; Kuniaki Takahashi, Akita; Kouji Kudou, Akita; Takeshi Itou, Akita, all of Japan

[73] Assignee: TDK Corporation, Japan

[21] Appl. No.: 909,311

[22] Filed: Jul. 6, 1992

[30] Foreign Application Priority Data

Dec. 21, 1991 [JP] Japan .................. 3-354898
Jan. 23, 1992 [JP] Japan .................. 4-031360

[51] Int. Cl.$^5$ ............................ B23P 19/00
[52] U.S. Cl. ...................... 29/740; 414/331; 414/416; 206/330
[58] Field of Search ............... 29/740; 414/331, 416, 414/417, 280, 787; 221/25, 70, 71, 197, 287; 206/330, 328

[56] References Cited

U.S. PATENT DOCUMENTS

| | | | |
|---|---|---|---|
| Re. 33,780 | 12/1991 | Itagaki et al. | 414/416 |
| 4,274,779 | 6/1981 | Longinatti | 414/416 |
| 4,631,816 | 12/1986 | Fujita et al. | 29/740 |
| 4,808,059 | 2/1989 | Eddy | 414/416 |
| 4,914,808 | 4/1990 | Okumura et al. | 29/740 |
| 4,999,909 | 3/1991 | Eguchi et al. | 29/740 |
| 5,046,911 | 9/1991 | Ogura et al. | 414/331 |
| 5,086,556 | 2/1992 | Toi | 29/740 |
| 5,143,253 | 9/1992 | Takahashi et al. | 221/197 |

FOREIGN PATENT DOCUMENTS

| | | |
|---|---|---|
| 391707 | 10/1990 | European Pat. Off. . |
| 0427243 | 11/1990 | European Pat. Off. . |
| 453370 | 10/1991 | European Pat. Off. . |
| 3919636 | 12/1989 | Fed. Rep. of Germany . |

Primary Examiner—Mark Rosenbaum
Assistant Examiner—David P. Bryant
Attorney, Agent, or Firm—Lerner, David, Littenberg, Krumholz & Mentlik

[57] ABSTRACT

An electronic component feed system capable of feeding an electronic component mounting apparatus with a variety of electronic components such as chips, lead-type electronic components and the like in various forms. A plurality of feeder modules corresponding to sorts of electronic components to be mounted on printed circuit boards are stored in a storage kit and transferred through the storage kit to an electronic component feed section of the mounting apparatus on which a printed circuit board is held. Then, the electronic components are mounted on the printed circuit board by means of a mounting head.

34 Claims, 19 Drawing Sheets

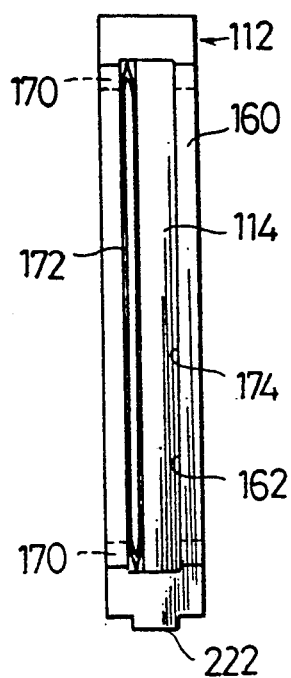
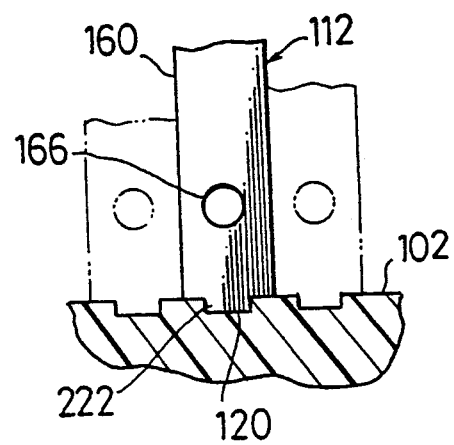
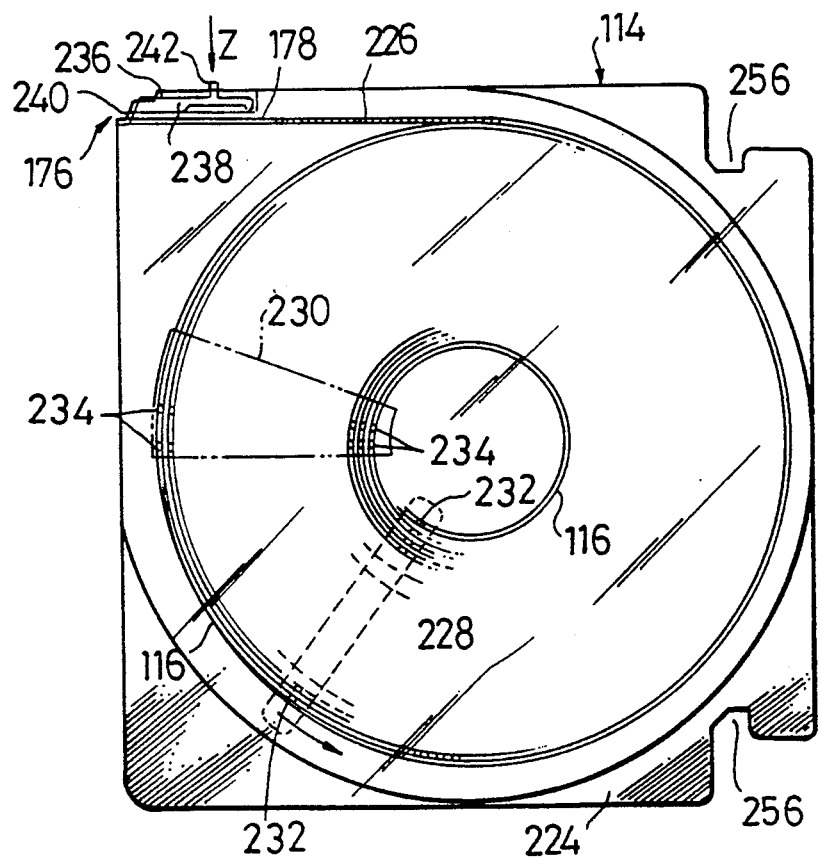

ELECTRONIC COMPONENT FEED SYSTEM

BACKGROUND OF THE INVENTION

This invention relates to feeding of electronic components such as chip-type electronic components (hereinafter referred to as "chips"), electronic components having lead wires (hereinafter referred to as "lead-type electronic components") and the like to an electronic component mounting apparatus, and more particularly to feeding of electronic components which is adapted to feed a mounting head of the mounting apparatus with electronic components by means of a storing unit such as a feeder module adapted to be detachable with respect to the mounting apparatus.

A electronic component feeder which has been conventionally used for an electronic component mounting apparatus is adapted to be fixedly arranged with respect to the mounting apparatus. Therefore, when it is required to mount a wide variety of electronic components on printed boards, the number of feeders to be arranged on the mounting apparatus must be increased, leading to large sizing of the electronic component mounting apparatus.

A conventional mechanism for feeding electronic components to the mounting apparatus includes feeder units corresponding to sorts of electronic components to be mounted on printed circuit boards. The conventional feeding mechanism causes each of the feeder modules to be emptied of electronic components when a mounting head of the mounting apparatus repeatedly carries out an operation of taking out electronic components from the feeder unit to successively mount them on printed circuit boards. In such situation, it has been conventionally carried out that the emptied feeder unit is replenished with electronic components by hands or the like or replaced with a feeder unit filled with electronic components. Further, the conventional mechanism often causes electronic components to be undesirably left in the feeder unit when a required mounting operation is completed. This causes interruption of the electronic component mounting apparatus to be required during manufacturing of printed circuit boards for one lot or much time and labor to be required for recovering and storing excessive electronic components after the manufacturing.

Also, the conventional electronic component feeding system fails to feed a variety of electronic components in various forms to the electronic component mounting apparatus, although such feeding is desired to develop an electronic component mounting apparatus which permits various kinds of electronic components fed in a variety of forms to be mounted on printed circuit boards. Such feeding forms include a package, a taping which comprises a tape and electronic components such as chips or lead-type electronic components held, for example, in a row on the tape. Also, the feeding is desired to be rapidly accommodated to change in lot of printed circuit boards during the manufacturing.

Recently, a tape, a magazine, a package and the like which have been conventionally used as a chip storing means has been replaced with a bulk-type storing case, which is constructed so as to randomly house chips in a case body and deliver the chips one by one from the case body and adapted to be mounted in the form of a chip feed means on a chip mounting apparatus. Such a bulk-type storing case is disclosed in, for example, Japanese Patent Application Laid-Open Publications Nos. 280129/1987 (62-280129), 22378/1988 (63-22378), 82974/1988 (63-82974) and 82975/1988 (63-82975).

The conventional bulk-type storing case is generally adapted to randomly store chips in a space defined in the case body and deliver the chips from a lower portion of the space through a delivery passage formed in the case body so as to communicate with an exterior of the case.

Unfortunately, the conventional bulk-type storing case causes the chips to be caught in the delivery passage, to thereby fail in smooth delivery of the chips; because the chips are outward delivered from the space of the case body formed into a large volume sufficient to randomly store the chips therein through the delivery passage substantially decreased in sectional area so as to permit only one chip to pass therethrough.

The assignee proposed a chip package wherein chips are stored in a spirally continuous packing path formed in a casing of the package, as disclosed in Japanese Patent Application No. 140994/1989 (1-140994). The chip package is manufactured and sold under a tradename "DISC PACK" from the assignee and adapted to concurrently exhibit both of a chip storage function and a chip feed function which have been deemed to contradict each other. For this purpose, the chip package is constructed so as to store chips in a row in the packing path of the casing and feed compressed air to the packing path to deliver the chips in order from a delivery port defined at an end of the packing path.

Unfortunately, when the chip package is used as a chip feed means for a chip mounting apparatus, the above-described construction of the chip package causes replacement of the chip package due to emptying of chips from the chip package or the like to be manually carried out. Thus, in order to ensure continuous running of a chip mounting apparatus, it is desired to accomplish automatic replacement of the chip package.

SUMMARY OF THE INVENTION

The present invention has been made in view of the foregoing disadvantages of the prior art.

Accordingly, it is an object of the present invention to provide an electronic component feeding method which is capable of satisfying a demand for feeding of a variety of electronic components.

It is another object of the present invention to provide a method of controlling feeding of electronic components which is capable of effectively preventing excess and deficiency of electronic components during mounting of the components for one lot, to thereby increase productivity.

It is a further object of the present invention to provide a storage kit or housing which is capable of storing packages of electronic components and tapings of electronic components therein to feed electronic components in various forms to an electronic component mounting apparatus and be readily accommodated to change in lot during the mounting It is yet another object of the present invention to provide a chip feeder module which is capable of facilitating replacement of a chip package and contributing to automation of chip package replacement.

It is even another object of the present invention to provide a feeder module mounting structure which is capable of permitting a chip feeder module to be replaceably mounted directly on a feeder base of a chip mounting apparatus, to thereby carry out automation of feeder module replacement.

It is a still further object of the present invention to provide a chip package which is capable of being automatically replaced.

It is a yet further object of the present invention to provide a chip replacing structure which is capable of removing a chip package emptied of chips from a chip feed section and supplying the chip feed section with a chip package charged with chips.

It is an even further object of the present invention to provide a chip package replacing method which is capable of removing a chip package emptied of chips from a chip feed section and supplying the chip feed section with a chip package charged with chips.

In accordance with one aspect of the present invention, an electronic component feeding method is provided. The method comprises the steps of storing, in a storage housing, a plurality of electronic component storing units corresponding to sorts of electronic components to be mounted on printed circuit boards; detachably putting at least one of the storing units through the storage housing on an electronic component feed section of an electronic component mounting apparatus for holding each of the printed circuit boards at a predetermined position; and feeding a mounting head of the electronic component mounting apparatus with each of the electronic components from the storing units.

In accordance with another aspect of the present invention, an electronic component feeding apparatus for an electronic component mounting apparatus for positioning a printed circuit board and mounting electronic components on the printed circuit board is provided. The apparatus comprises a storage housing for storing a plurality of electronic component storing units corresponding to sorts of electronic components to be mounted on the printed circuit boards; and an electronic component feed section arranged at the electronic component mounting apparatus for detachably putting at least one of the storing units fed from the storage housing. The electronic components are fed from the storing unit to the mounting head.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein

FIG. 15 is a rear elevation view of the chip feeder module shown in FIG. 14;

FIG. 16 is a fragmentary sectional front elevation view showing arrangement a chip feeder module with respect to a feeder base of a mounting apparatus;

FIG. 17 is a side elevation view showing an example of a chip package of a disc-like shape;

DETAILED DESCRIPTION OF THE PREFERRED EMBODIMENTS

Now, an electronic component feed system of the present invention will be described with reference to the accompanying drawings.

Figure 1:
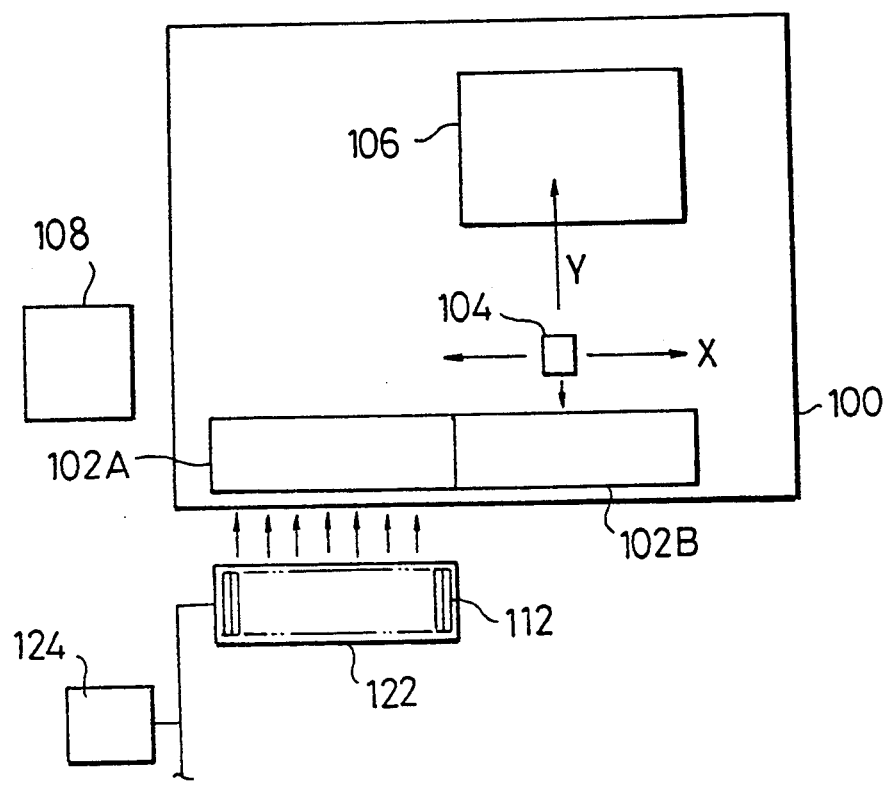
FIG. 1 is a schematic view showing a general construction of an electronic component feeding and mounting system according to the present invention.

FIG. 1 shows a general construction of an electronic component feeding and mounting system suitable for practicing an electronic component feeding method according to the present invention. The system includes an electronic component mounting apparatus 100, which includes two feeder bases or electronic component feed sections 102A and 102B for placing electronic components thereon and an electronic component mounting head 104 for mounting electronic components on a printed circuit board 106 positioned on the mounting apparatus 100. The feeder bases each may serve as an electronic component feed section of the mounting apparatus 100. The mounting head 104 is adapted to be movable horizontally, for example, in X-Y directions, as well as vertically.

Figure 2:
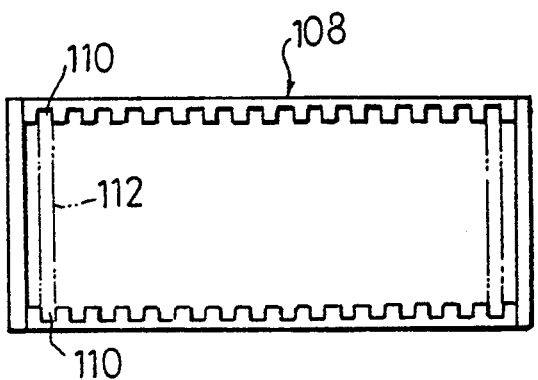
FIG. 2 is a front elevation view showing one example of a feeder stocker suitable for use in the system of FIG. 1.
Figure 3:
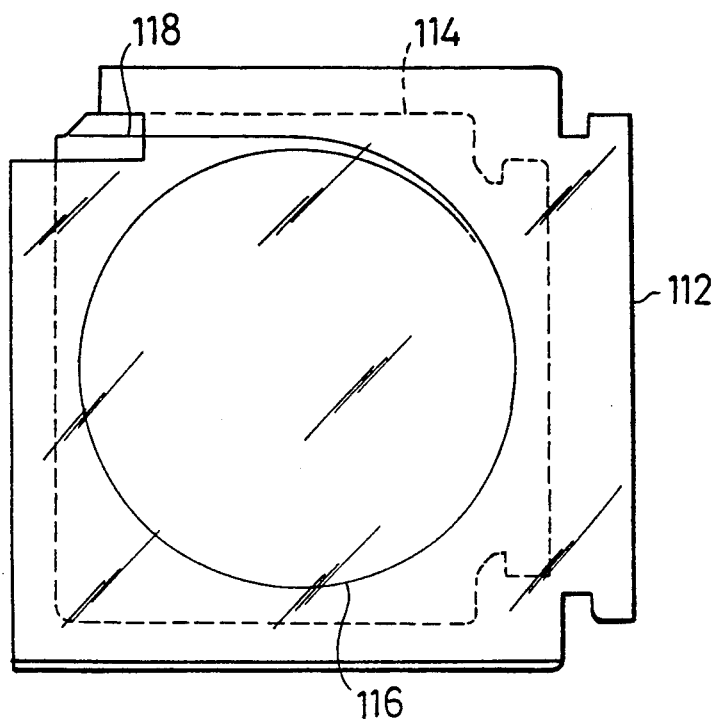
FIG. 3 is a schematic front elevation view showing an example of a feeder module.

Also, the system includes a feeder stocker 108 of a box-like shape, which is provided on upper and lower inner surfaces thereof with positioning grooves 110 through which a variety of storing units or feeder modules 112 are removably stocked in the stocker 108 while being vertically erected, as shown in FIG. 2. The feeder modules 112 each have a storing unit or electronic component package 114 replaceably or detachably received therein, which package is adapted to pack a plurality of electronic components in a row in a packing path 116 spirally continuously formed in the package 114, as shown in FIG. 3. In the present invention, the words "storing unit" are used to indicate a feeder module, a package, a taping, a combination thereof, or the like.

The feeder module 112 is provided therein with a means for positioning the package 114 in the feeder module 112, a passage through which compressed air is supplied to the packing path 116 to discharge electronic components from a linear discharge path formed in the electronic component package 114 so as to linearly extend from the packing path, and the like.

Figure 4:
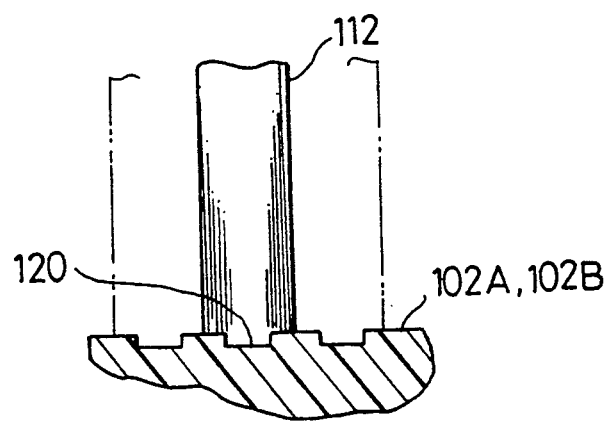
FIG. 4 is a fragmentary sectional view showing an essential part of a feeder base or electronic component feed section of a chip mounting apparatus.

The electronic component feed sections or feeder bases 102A and 102B each are formed thereon with recesses 120 for positioning the feeder modules 112, as shown in FIG. 4.

The system of the illustrated embodiment also includes a storage kit or housing 122 which is adapted to store therein a plurality of feeder modules 112 transferred thereto from the feeder stocker 108 in readiness for further transfer of the feeder modules to the feeder base 102A, and an edit unit 124.

In the illustrated embodiment constructed as described above, the storage kit 122, is rendered opposite to the feeder stocker 108, and the feeder modules 112 corresponding to sorts of electronic components to be mounted on the printed circuit board 106 are selected and transferred from the feeder stocker 108 to the storage kit 122. Also, the edit unit 124 carries out an edit operation which permits each of the feeder modules 112 to contain electronic components corresponding in number to the printed circuit boards to be manufactured. Then, the storage kit 122 is rendered opposite to the feeder base 102A of the mounting apparatus 100, so that all feeder modules 112 held in the storage kit 122 are transferred onto the feeder base 102A in a lump. The electronic component mounting head 104 receives an electronic component from each of the feeder modules put on the feeder base 102A to mount them on the printed circuit boards 106 successively. The same electronic component feed operation is carried out with respect to the feeder base 102B before mounting of electronic components of the feeder modules onto the printed circuit boards is completed. Thus, when electronic components are mounted on a predetermined number of the printed circuit boards, resulting in each of the feeder modules 112 on the feeder base 102A being empty, mounting of electronic components with respect to printed circuit boards for one production lot is completed. Thereafter, mounting of electronic components on printed circuit boards for the next production lot is started using the feeder modules 112 put on the feeder base 102B and the emptied feeder modules 112 on the base 102A are removed therefrom by means of the storage kit 122 and replaced with another set of feeder modules.

Thus, in the illustrated embodiment, the feeder modules 112 which feed electronic components to be mounted on the printed circuit boards may be replaced by means of the storage kit 122 in a lump, to thereby significantly reduce a period of time required for change in lot of electronic components due to change in lot of printed circuit boards. Also, the edit unit 124 permits the number of electronic components to be stored in the feeder module 112 to correspond to that of printed circuit boards to be manufactured, resulting in the yields being highly improved. Further, the illustrated embodiment is so constructed that the electronic component package 114 having a number of electronic components stored in a row in the spirally continuous packing path 116 is replaceably or detachably arranged in feeder module 112. Such construction permits the feeder modules to be suitably selected with respect to a variety of electronic component packages different in configuration and size, so that the illustrated embodiment may be accommodated to mounting of a variety of electronic components such as chips, lead-type electronic components and the like on the printed boards.

Figure 5:
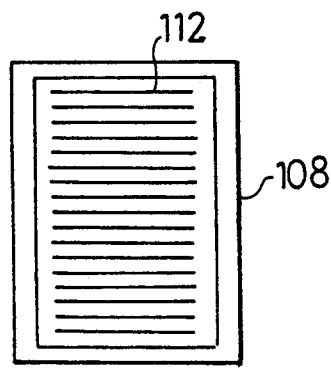
FIG. 5 is a front elevation view showing another example of a feeder stocker.
Figure 6:
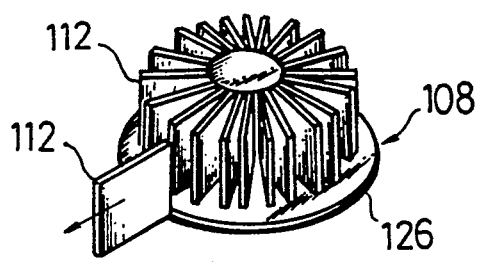
FIG. 6 is a perspective view showing a further example of a feeder stocker.
Figure 7:
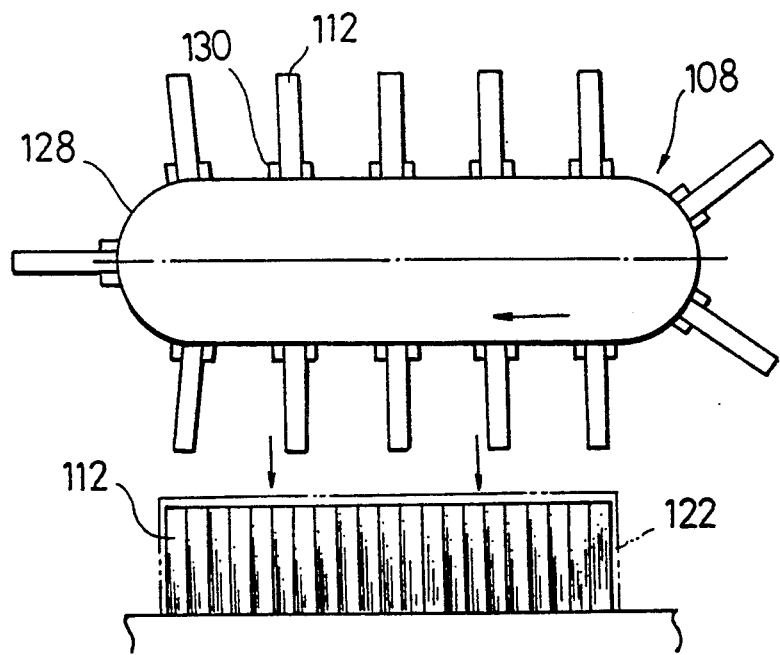
FIG. 7 is a front elevation view showing still another example of a feeder stocker.

FIGS. 5 to 7 each show a modification of the feeder stocker. A feeder stocker 108 shown in FIG. 5 is formed into a box-like shape and is adapted to removably stock a variety of feeder modules 112 while laying them in a row horizontally. A feeder stocker 108 of FIG. 6 is constructed so as to radially support various feeder modules 112 on a rotating disc 126 in a removable manner. A feeder stocker 108 of FIG. 7 includes a belt conveyor 128 rotated in a vertical plane above the storage kit 122 located at a stationary or standby position and holders 130 mounted on the belt conveyor 128 so as to removably hold various feeder modules 112 thereon, so that the feeder modules may be downward transferred to predetermined positions of the storage kit 122 standing by means of movement of the belt conveyor 128.

In the illustrated embodiment, the feeder module is mounted therein with the electronic component package, however, an electronic component taping may be mounted therein in place of the package.

As can be seen from the foregoing, the electronic component feeding method of the illustrated embodiment is so constructed that the feeder module for feeding electronic components separately and successively is arranged in a manner to be detachable with respect to the electronic component mounting apparatus and the feeder modules corresponding to electronic components to be mounted on the printed circuit boards are positioned on the feeder base or electronic component feed section. Thus, the illustrated, embodiment decreases the number of feeder modules to be constantly provided for the electronic component mounting apparatus and substantially reduces a period of time required for change in lot of printed circuit boards.

The present invention is also directed to controlling of feeding of electronic components, which is adapted to feed electronic components of desired sorts in a required quantity to such a storage kit as described above and practiced in a manner as shown in FIG. 8.

Figure 8:
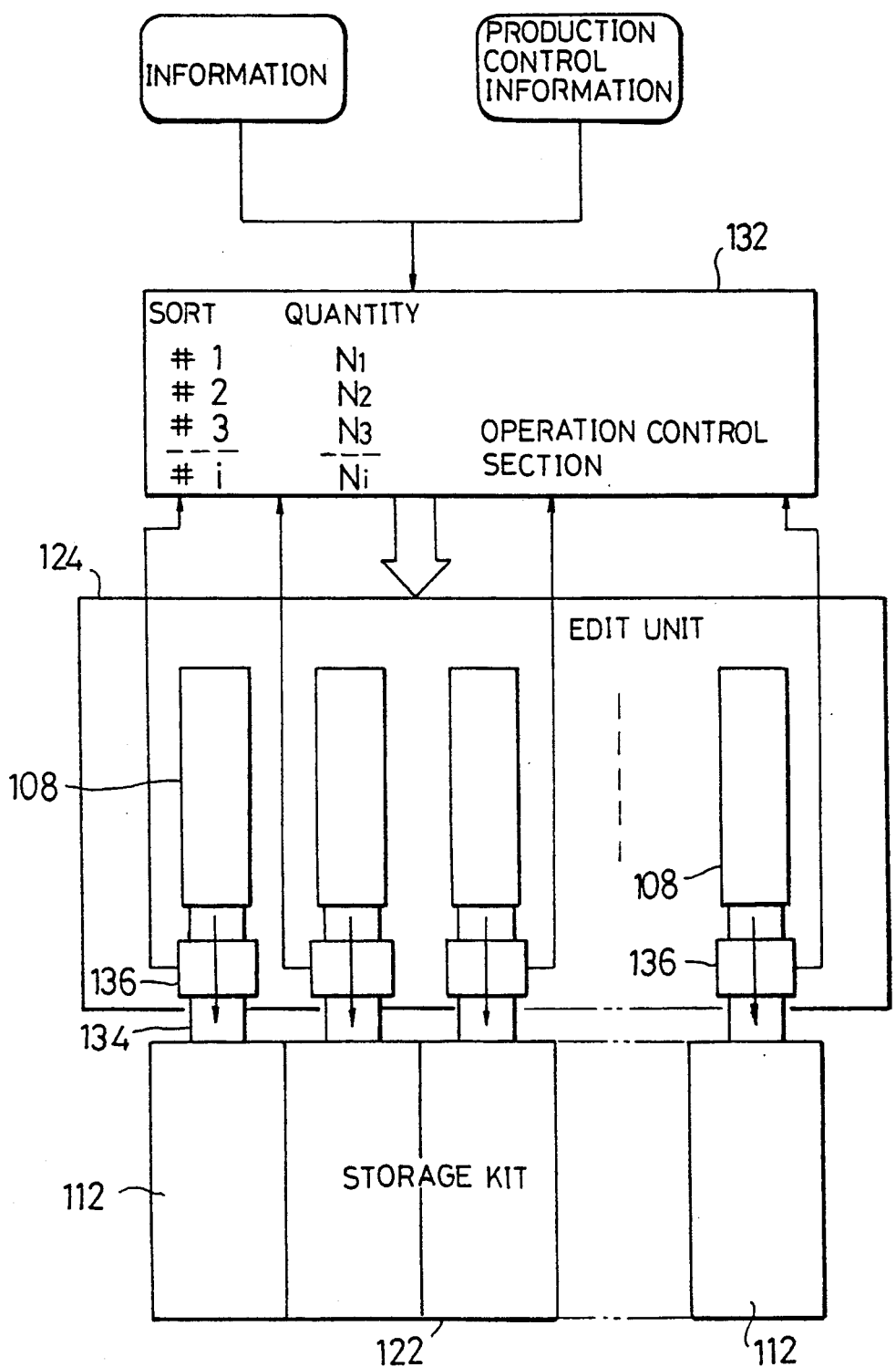
FIG. 8 a flow chart showing a manner of controlling feeding of chips.

In FIG. 8, reference numeral 132 designates an operation control section, 124 is an edit unit and 122 is a storage kit or housing. The operation control section 132 is fed with CAD information from a CAD (computer aided design) unit (not shown) and production control information from a production control unit (not shown). The edit unit 124 includes a plurality of electronic component feed sources 108 which are adapted to feed electronic components different in sort from each other such as chips, lead-type electronic components and the like, respectively. The feed stockers 108 include a feed passage 134 provided with a counter 136 for counting the number of electronic components fed through the passage 134. A value counted by each of the counters 136 is input to the operation control section 132. The storage kit 122 has a plurality of feeder units or feeder modules 112 arranged therein. The feeder modules 112 each are adapted to feed electronic components of one sort to an electronic component mounting apparatus when the storage kit 122 is located at a predetermined position with respect to the mounting apparatus.

Now, the manner of controlling feeding of electronic components will be described hereinafter with reference to FIG. 8.

The CAD information contains information on sorts and a quantity of electronic components required for manufacturing one printed circuit board and the production control information contains information on the number of printed circuit boards for one lot to be manufactured. Therefore, the operation control section 132 determines sorts of a quantity of electronic components required for one lot based on the CAD information and production control information. In FIG. 8, for example, the number of electronic components of sort #1 is determined to be $N_1$, and those of sorts #2, #3, - - - , #i are determined to be $N_2$, $N_3$, - - - , $N_i$, respectively. The operation control section 132 feeds the edit unit 124 with a result of the determination to control it, so that electronic components of sort #1 may be fed from the feed source 108 corresponding to sort #1 to the feeder module 112 of the storage kit 122. Likewise, electronic components of sorts #2 to #i are fed from the feed sources 108 corresponding to the sorts to the feeder module 112 of the storage kit 122, respectively. The number of electronic components of each sort is counted through the counter 136 and a result of the counting is feedbacked to the operation control section 132, leading to contribution to further control. Thus, the storage kit 122 is fed with electronic components of sorts required for one lot in a required quantity Thus, when the storage kit 122 is used as an electronic component feed means for the electronic component mounting apparatus, the electronic component mounting operation is effectively carried out. More particularly, this prevents a shortage of electronic components from occurring during mounting for one lot, to thereby eliminate disadvantages such as interruption of the mounting apparatus, replacement of the feeder module and replenishment of electronic components to the feeder module, as well as recovery and storage of excessive electronic components after mounting for one lot.

Also, when the storage kits each having electronic components of desired sorts stored therein in a quantity required for each lot are previously prepared, it is possible to replace the storage kit emptied due to mounting of electronic components for one lot with a storage kit filled with electronic components for the next one lot.

Thus, the control method of the present invention feeds the storage kit used as an electronic component feed means for the electronic component mounting apparatus with electronic components of sorts required for one lot in a required quantity, to thereby prevent excess and deficiency of electronic components during mounting for one lot, resulting in improving the productivity.

Figure 9:
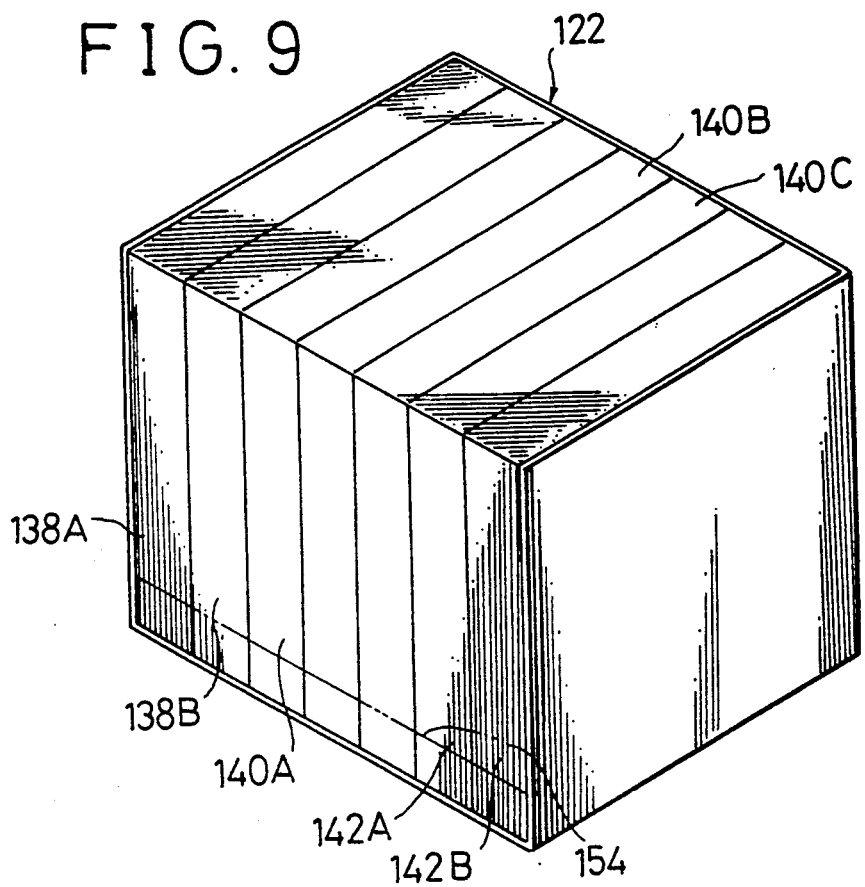
FIG. 9 is a perspective view showing a storage kit or housing suitable for use in the present invention.
Figure 10:
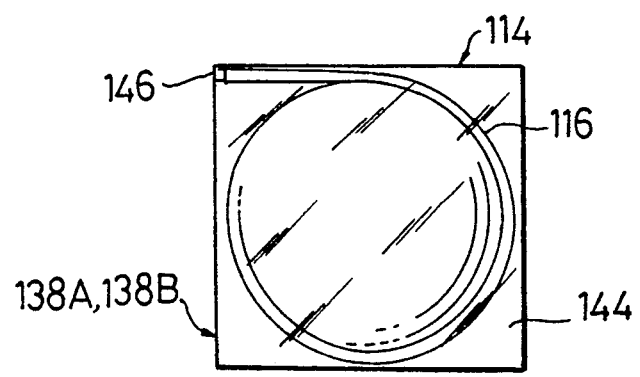
FIG. 10 is a schematic view showing a chip package.
Figure 11:
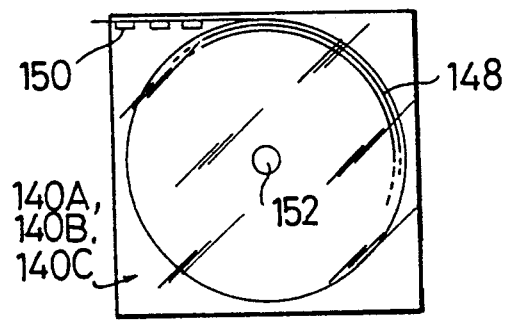
FIG. 11 is a schematic view showing a rolled chip taping.
Figure 12:
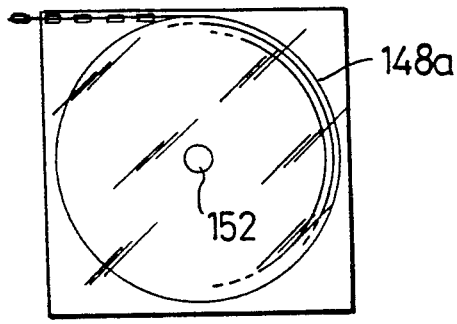
FIG. 12 is a schematic view showing a rolled lead-type electronic component taping.
Figure 13:
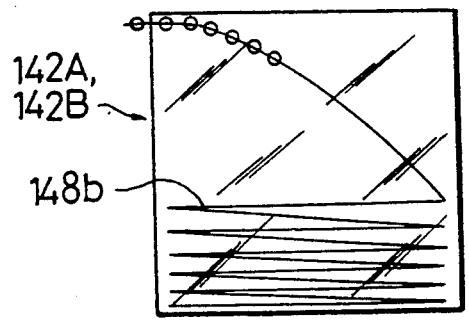
FIG. 13 is a schematic view showing a zigzag electronic component taping.

FIG. 9 shows a storage kit or housing of another form which may be suitably used in the present invention. The storage kit 122 includes compartment 138A and 138B for detachably storing chip packages, compartments 140A, 140B and 140C for detachably storing rolled chip tapings, and compartments 142A and 142B for detachably storing zigzag electronic component tapings. The compartments 138A and 138B each serve to store a chip package 114 which is adapted to pack a plurality of chips in a row or rows in a spirally continuous packing path 116 formed in a resin casing 144 of the chip package 114 and provided at a distal end thereof, with a feed port 146, as shown in FIG. 10. The compartments 140A to 140C each are adapted to store a rolled chip taping 148, which is formed by rolling a taping comprising a tape formed thereon with embosses 150 and chips received in the embosses around a reel, as shown in FIG. 11. For this purpose, the compartments each are provided with a boss 152 on which the reel of the rolled chip taping 148 is fitted to permit the taping 148 to be rotated about the boss 152. Alternatively, as shown in FIG. 12, a lead-type electronic component taping 148a which comprises a tape and lead-type electronic components held thereon and is rolled may be arranged in place of the rolled chip taping 148 in the compartment in a manner to be rotatable about the boss 152. The compartments 142A and 142B each are adapted to store therein, for example, a zigzag lead-type electronic component taping 148b which comprises a tape and lead-type electronic components held thereon and is folded in a zigzag manner. Electronic components stored in each of the compartments are adapted to be fed at the same height in the storage kit 122.

Thus, the illustrated embodiment is accommodated to feeding of three kinds of electronic components, resulting in being suitably used as an electronic component feed means for an electronic component mounting, apparatus having a function of mounting a variety of electronic components. Also, the illustrated embodiment may be so constructed that all electronic components of sorts required for mounting for a specific lot are stored in the storage kit 122. Such construction permits change in lot to be highly facilitated by replacement of the storage kit 122.

The number of compartments defined in the storage kit 122 may be varied as desired and arranged in a manner to be detachable with respect to the chip or electronic component mounting apparatus. Further, in FIGS. 10 to 13, the electronic components are fed from the upper portion of the chip package 114, however, they may be fed from a lower portion thereof as indicated at phantom lines 154 in FIG. 9.

Thus, it will be noted that the storage kit or housing of the illustrated embodiment can be effectively accommodated to feeding of electronic components in various forms such as a chip taping, a chip package, a lead-type electronic component taping and the like and permits change in lot during manufacturing of printed circuit boards to be rapidly carried out.

Figure 14:
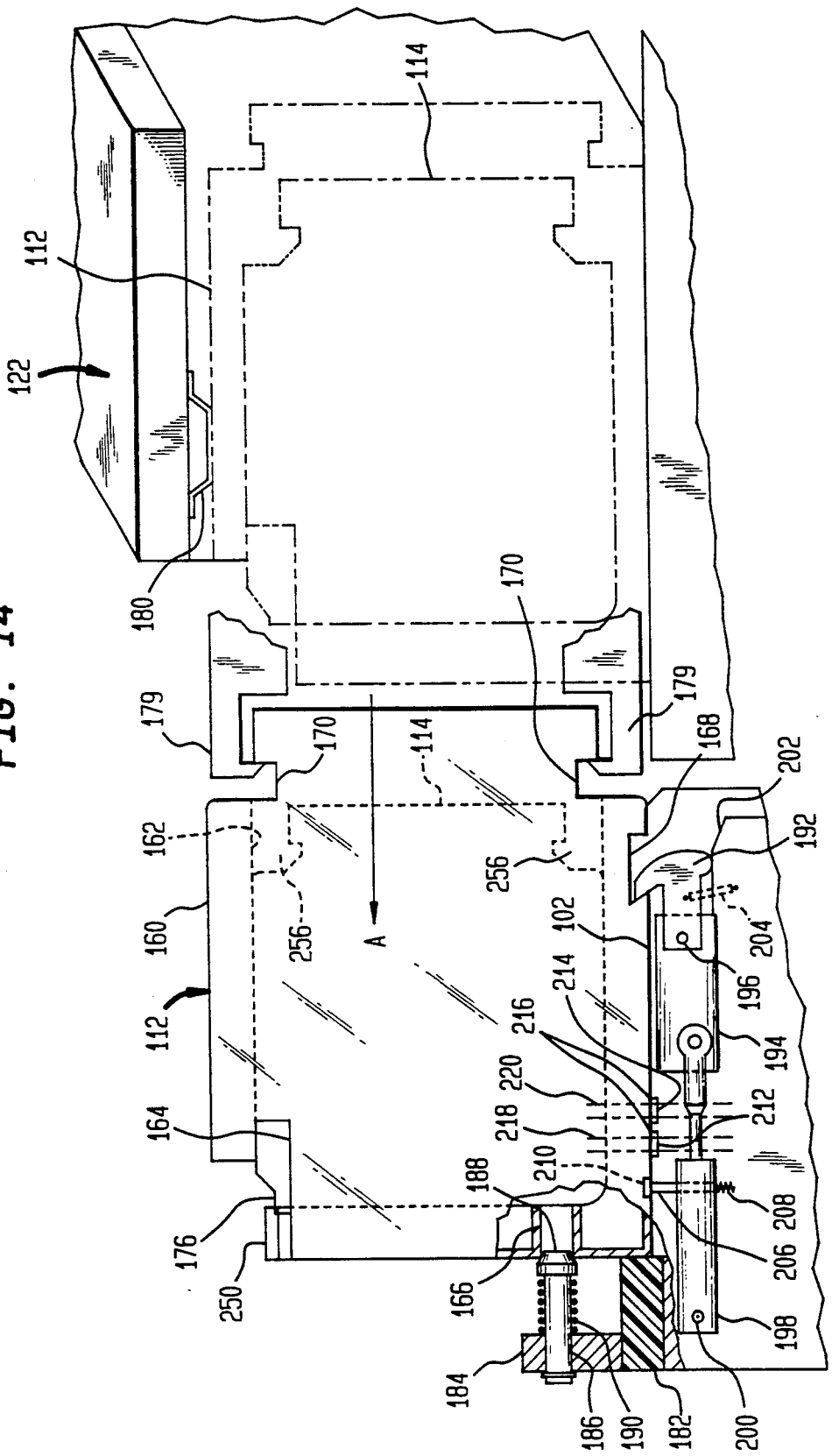
FIG. 14 is a schematic side elevation view showing a chip feeder module and its mounting structure in the present invention.

FIGS. 14 to 16 show a chip feeder module of another form suitable for use in the present invention and a structure for mounting it.

A feeder module generally designated at reference numeral 112 in FIGS. 14 to 16 includes a casing 160 formed of a resin material or the like and into a rectangular parallelopiped shape. The casing 160 is formed with a recess 162 for housing a chip package 114, a feed window 164, a positioning recess 166, a holding recess 168 and engagement recesses 170 for replacement.

The chip package housing recess 162 is formed into a rectangular shape in section. Also, the recess 162 is formed into a width equal to that of the chip package 114 and a depth larger than a thickness of the chip package 114. In the recess 162 is also arranged a bellowphragm 172 in a manner to be positioned along one surface thereof. The bellowphragm 172, when air is fed thereinto, is adapted to be expanded to press one surface of the chip package 114, to thereby pressedly contact the chip package 114 with a reference plane 174 which is the other surface of the recess 162.

The feed window 164 is arranged at an upper portion of a front end of the casing 160 and adapted to expose a distal end 176 of a chip delivery passage 178 provided at an upper portion of the chip package 114 enlargedly shown in FIGS. 18 to 21. The positioning recess 166 is formed into a circular shape in cross section and arranged at a front end surface of the casing 160. It functions to prevent the feeder module 112 from being deviated in a lateral direction in FIG. 16. The holding recess 168 is positioned on a bottom surface of the casing 160 and serves to fix the casing 160 on a feeder base or chip feed section 102 of a chip mounting apparatus when the chip feeder module 112 is placed on the feeder base.

The engagement recesses 170 for replacement are arranged at upper and lower portions of a rear end of the casing 160 and engaged with a hook 179 of an autochanger provided on the chip mounting apparatus. The chip feeder module 112 is detached from the feeder base 102 of the chip mounting apparatus or a feeder module filled with chips is taken out from a storage kit 122 to be positioned on the feed base 102, while keeping recesses 170 engaged with the hook 179. The storage kit or housing 122 serves to removably store a plurality of chip feeder modules 112 therein while erecting them and is provided on an inner surface thereof with a leaf spring 180 for preventing backlash of the feeder modules 112 in the kit 122. The storage kit 122 is transferred to a position parallel to the feeder base 102 by a suitable transfer means (not shown) for positioning with respect to the feeder base 102.

The feeder base 102 has a module stopper 182 in the form of a block fixed thereon so that it may be abutted against the front end surface of the casing 160 of the feeder module 112. The stopper block 182 is provided thereon with a vertically extending support member 184. The support member 184 is formed with a throughhole so as to extend in a longitudinal direction of the feeder base 102, via which a positioning pin 186 is slidably inserted. The positioning pin 186 is formed at a tip end thereof with a frust-conical head 188 and constantly forward forced by means of a compression spring 190. The frust-conical head 188 of the positioning pin 186 is fitted in the circular positioning recess 166 of the casing 160 to carry out positioning of the feeder module 112 in a lateral direction of the feeder base 102 (or a direction perpendicular to the sheet of FIG. 14).

The feeder base 102 is provided with a clamper 192 adapted to be engaged with the holding recess 168 of the casing 160, a slider 194 on which the clamper 192 is pivotally mounted through a pin 196, and an air cylinder 198 for moving the slider 194 in the longitudinal direction. The slider 194 is supported on the side of the feeder base 102 in a manner to be slidable in the longitudinal direction and the air cylinder 198 is pivotally mounted on the side of the feeder base 102 by means of a pin 200. In order to actuate the clamper 192, a cam 202 is fixedly arranged below an upper surface of the feeder base 102, so that the clamper 192 may be abutted at a lower end thereof against the cam 202. An extension spring 204 is provided so as to pressedly contact the clamper 192 with the cam 202. Thus, when a piston rod of the air cylinder 198 is extended, the lower end of the clamper 192 is downward moved along the cam 202, so that a locking portion provided at an upper portion of the clamper 192 is disengaged from the holding recess 168 of the casing 160; whereas when the piston rod of the cylinder 198 is contracted, the lower end of the clamper 192 is upward moved along the cam 202 to engage the locking portion of the clamper 192 with the holding recess 168 of the casing, so that the module stopper block 182 and clamper 192 cooperate together to securely position the casing 160 on the feeder base 102.

The feeder base 102 is provided with a probe (electrical contact) 206 constantly urged in a projecting direction by means of a compression spring 208. The probe 206 is adapted to be contacted with an electrode 210 arranged on a bottom surface of the casing 160, which is connected to a sensor (not shown) for detecting a residue of chips stored in the chip package 114.

Also, the feeder base 102 is provided with compressed air feed ports 212 and 214 connected to a compressed air source. The air feed ports 212 and 214 each are provided with an O-ring 216. The compressed air feed port 212 is connected to a compressed air passage 218 formed in the chip feeder module 112 so as to feed it with compressed air, which is then introduced into the chip package 114 for dispensing chips in the chip package in order. The compressed air feed port 214 is connected to a compressed air passage 220 formed in the chip feeder module 112 to feed the bellowphragm 172 with compressed air.

The feeder base or chip feed section 102, as shown in FIG. 16, is provided thereon with a plurality of guide recesses 120, which are arranged in a manner to be spaced from each other at predetermined intervals, so that a projection 222 formed on a bottom of the casing 160 so as to extend in a longitudinal direction thereof may be slidably fitted in the groove 120.

The chip package 114, as shown in FIG. 17, includes a body or casing 224 made of resin, which is formed therein with a spirally continuous packing path 116 for storing chips 226 in a row or rows therein. The packing path 116 is formed at an outermost peripheral portion thereof into a linear shape so that it may serve as the chip delivery passage 178. Portions 228 and 230 of the casing 224 at which the packing path 116 and chip delivery passage 174 are provided are formed with an air inlet hole 232 and an air outlet hole 234 corresponding to each of ring portions of the packing path 116, respectively, so that compressed air introduced from the air inlet hole 232 flows in a counterclockwise direction in the packing path 116 and exits from the air outlet hole 234 to deliver the chips 226 received in the spiral packing path 116 toward the outermost chip deliver passage 178.

Figure 18:
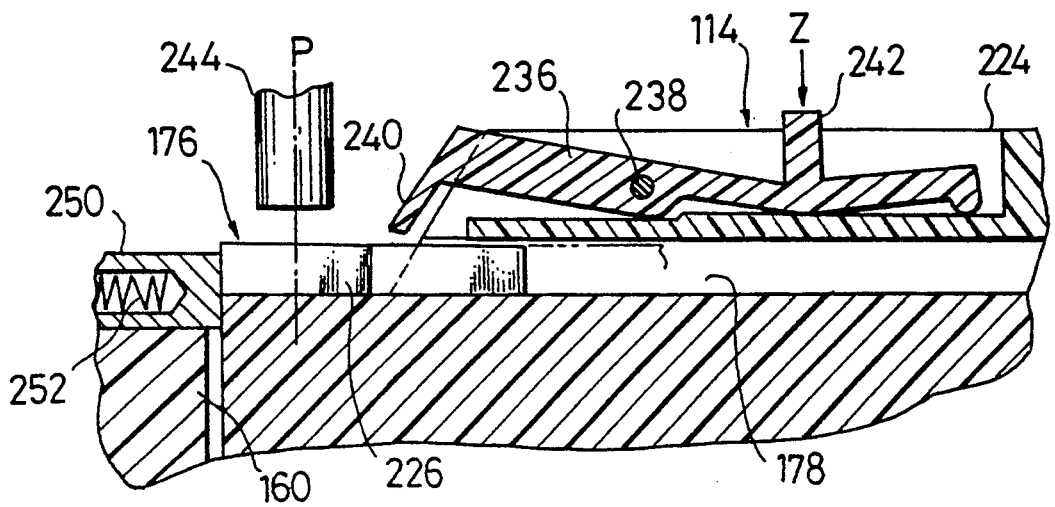
FIG. 18 is a fragmentary enlarged sectional view showing a distal end of a chip delivery passage provided in an upper portion of the chip package shown in FIG. 17 and a periphery thereof.
Figure 19:
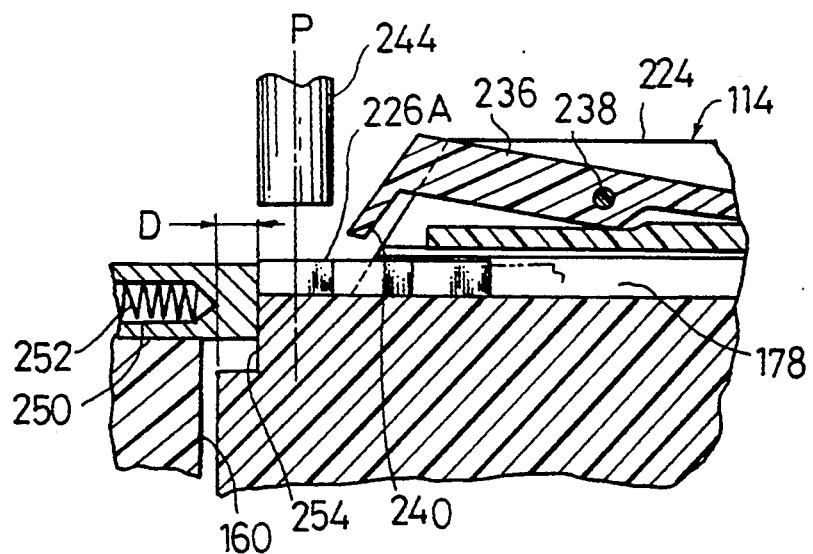
FIG. 19 is a fragmentary enlarged sectional view showing a distal end of a chip delivery passage provided in an upper portion of a chip for chips different in configuration and a periphery thereof.

The chip delivery passage 178, as shown in FIGS. 18 and 19, is provided at a distal end thereof with a shutter 236 formed of a flexible resin material, which is pivotally mounted on the casing 224 through a pin 238. The shutter 236 is raised at a distal end 240 thereof when a pressing projection 242 formed integral with the shutter 236 is downward pressed in a direction indicated at Z in FIG. 18, so that the distal end of the chip delivery passage 178 may be open to permit the chip 226 to be delivered to a chip feed position located right below a chip mounting or suction nozzle 244 or the distal end 176 of the chip delivery passage 178.

Figure 20:
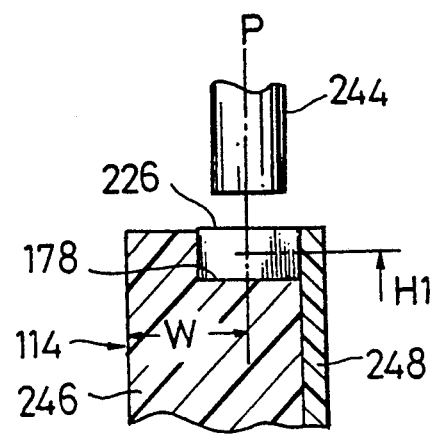
FIG. 20 is a fragmentary enlarged sectional front elevation view showing a distal end of a chip delivery passage of a chip package.
Figure 21:
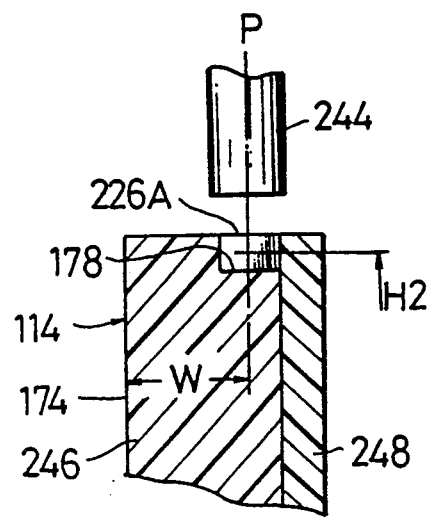
FIG. 21 is a fragmentary enlarged sectional front elevation view showing a distal end of a chip delivery passage of a chip package for chips different in configuration.

A sectional configuration of the linear chip delivery passage 178 is illustrated in each of FIGS. 20 and 21. A parts plate 246 which constitutes a part of the casing 224 is formed with the linear chip delivery passage 178 and spiral packing path 116 shown in FIG. 17, and a cover plate 248 integrated with the parts plate 246 is adapted to cover the chip delivery passage 178 and packing path 116. The air inlet hole 232 is formed on the side of the parts plate 246, whereas the air outlet hole 234 is formed on the side of the cover plate 248. A parts stopper 250 is arranged on the side of the chip feeder module 112 having the chip package 114 stored therein. More particularly, the parts stopper 250 is arranged so as to be slidable in the longitudinal direction with respect to the casing 160 and constantly forward urged by means of a compression spring 252, resulting in being abutted against the distal end of the linear chip delivery passage 178 or an upper portion of a front end surface of the casing 224 of the chip package 114.

Now, the manner of operation of the feeder module 112 constructed as described above will be described hereinafter.

In the storage kit 122 are arranged a number of chip feeder modules 112 in juxtaposition with each other, in each of which the chip package 114 having a predetermined number of chips received therein is stored. The hook 179 of the auto-changer of the chip mounting apparatus is engaged with the engagement recesses 170 of selected one of the chip feeder modules 112 stored in the storage kit 122, so that the feeder module 112 selected is placed on a predetermined position of the feeder base 102 while being slid as indicated at an arrow A in FIG. 14. This causes the projection 222, on the bottom of the feeder module 112 to be fitted in the guide recess 120, resulting in the feeder module 112 advancing and being abutted against the module stopper block 182. This causes the circular positioning recess 166 to be fitted on the frust-conical head 188 of the positioning pin 186 to correct lateral deviation of the feeder module 112, to thereby properly position it on the feeder base 102. Then, the air cylinder 198 is actuated to upward move the locking portion of the upper end of the clamper 192, so that the locking portion may be engaged with the holding recess 168 of the casing 160 to interposedly hold between the stopper block 182 and the clamper 192. Then, compressed air is fed through the compressed air feed port 214 and compressed air passage 220 to the bellowphragm 172 in the feeder module 112 to pressedly contact the chip package 114 with the reference plane 174, to thereby properly position the chip package 114 with respect to the feeder module 112.

Feeding of chips 226 to the suction nozzle 244, as shown in FIG. 18, is carried out by pressing the projection 242 of the shutter 236 of the chip package 114 in the direction of the arrow Z to open the distal end 240 of the shutter 236 and feeding compressed air from the compressed air feed port 212 through the compressed air passage 218 to the air inlet hole 232 to generate an air flow in the counterclockwise direction in FIG. 17 in the spiral packing path 116, to thereby deliver the chips 226 to the linear chip delivery passage 178 communicating with the packing path 116, to thereby abut foremost one of the chips 226 with the stopper 250 as shown in FIG. 18. The foremost chip 226 thus positioned by the stopper 250 is so set that a central position of the chip in longitudinal and width directions thereof is aligned with a center P of the nozzle 244, as shown in FIGS. 18 and 20. At this time, in order to cope with a small-sized chip 226A, as shown in FIG. 19, the chip package 114 is formed at an upper portion of a front end surface thereof with a recess 254 providing an offset D. This permits projection of the stopper 250 to be increased by an amount corresponding to the offset D, resulting in the chip 226A being so set that a center of the chip 226A in a longitudinal direction thereof may be aligned with the center P of the suction nozzle 244. With respect to a variation in a width direction due to the chip 226A, as shown in FIG. 21, a distance W between the center of the chip 226A in the width direction and the reference plane 174 is kept constant irrespective of a width of the chip or at the same dimension as in FIG. 20, and correspondingly the cover plate, 248 is varied in thickness. Thus, the chip decreased in length and width is likewise properly set so that the center of the chip in both longitudinal and width directions may be aligned with the center P of the suction nozzle 244. A variation in thickness between the chips 226 and 226A may be absorbed by setting the chip delivery passage 178 at a height sufficient to permit a center of the chip in a thickness direction in the chip delivery passage 178 to be at a constant height. More particularly, a height H1 between a center of the chip 226 in a thickness direction thereof and the bottom of the chip package is rendered equal to a height H2 between a center of the chip 226A in a thickness direction thereof and the bottom of the chip package. This eliminates adjustment of the feeder module 112 depending on the sort of chips. This permits the suction nozzle 244 to transfer each of the chips 226 and 226A by suction while being aligned with the center of the chip.

The chip package 114 may be provided with additional engagement recesses 256 for replacement, so that it may be automatically replaced with another one through engagement between the recesses 256 and the auto-changer of the chip mounting apparatus.

As described above, the chip feeder module of the illustrated embodiment is so constructed that the chip package which has chips stored in a row or rows in the spirally continuous packing path and positively delivers the chips is replaceably held in the feeder module. Such construction highly facilitates replacement of the chip package and contributes to automation of replacement of the chip package. Also, the feeder module mounting structure of the illustrated embodiment permits the chip feeder module to, be replaceably mounted directly on the feeder base of the chip mounting apparatus, to thereby carry out automation of feeder module replacement.

Figure 22:
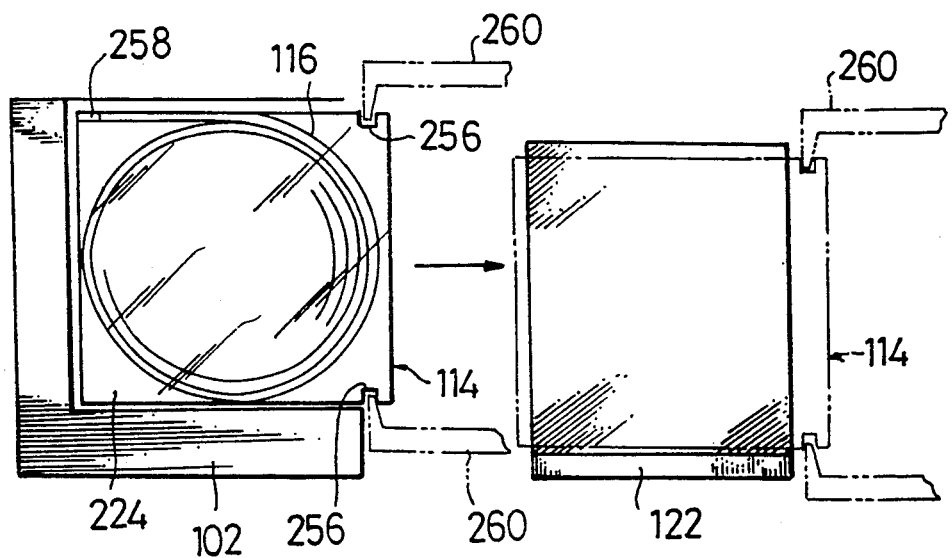
FIG. 22 is a side elevation view showing a chip package of another form which is suitable for use in the present invention.

Referring now to FIG. 22, a chip package of another form which may be suitable for use in the present invention is illustrated. The chip package generally designated at reference numeral 114 includes a casing 224 made of a resin material, in which a spirally continuous packing path 116 is formed. The packing path 116 is provided at a distal end thereof with a chip delivery port 258 which is openable by means of a shutter (not shown). The casing 224 is formed on each of upper and lower surfaces thereof with an engagement recess 256.

The chip package 114 thus constructed may be replaceably mounted in the form of a chip feed source on a chip feed section of a chip mounting apparatus such as a feeder base 102. More particularly, when the chip package 114 mounted on the feeder base 102 is emptied of chips, a hook or chuck 260 is engaged with the engagement recesses 256 and then removed from the feeder base into a storage kit 122 as indicated at phantom lines in FIG. 22. Then, a subsequent chip package filled with chips is transferred onto the feeder base 102 by means of the chuck 260.

Figure 23:
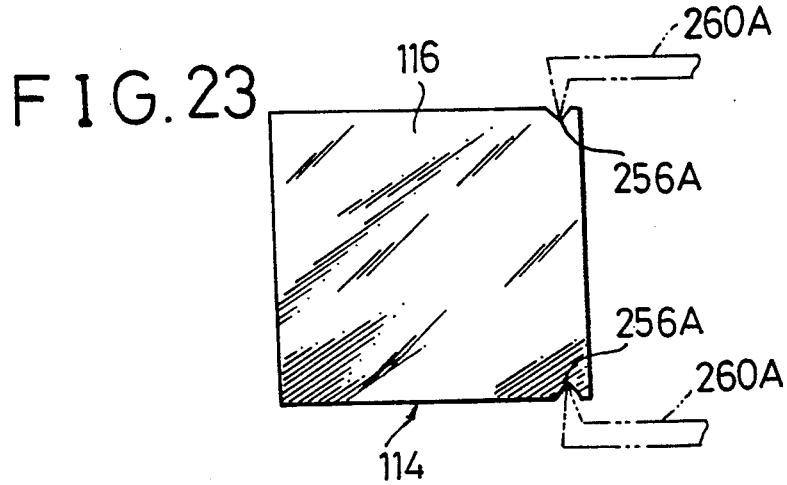
FIG. 23 is a schematic side elevation view showing a modification of the chip package of FIG. 22.

FIG. 23 shows a modification of the chip package of FIG. 22. In a chip package 114 of the modification, a casing 116 is formed on each of upper and lower surfaces thereof with a V-shaped engagement recess 256A. The V-shaped engagement recesses 256A are engaged with a chuck 260A of which distal ends are formed into a sharp shape. Such construction permits alignment or registration of the chip package with respect to the feeder base 102 to be accurately carried out.

Figure 24:
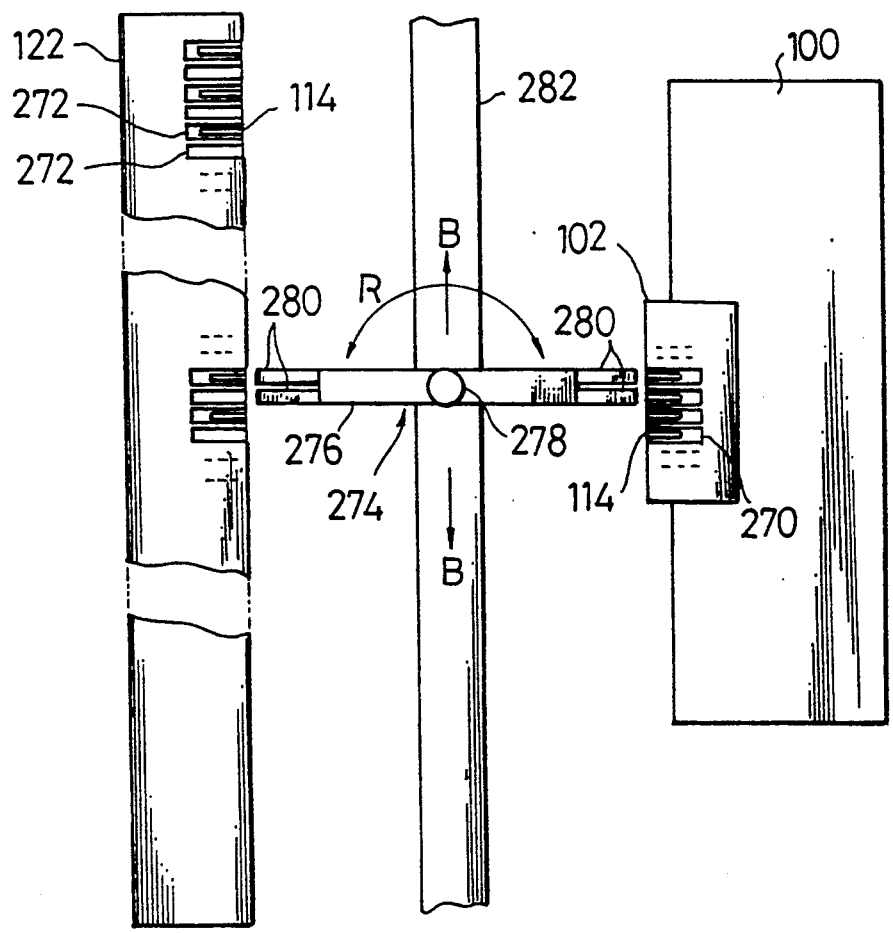
FIG. 24 is a schematic plan view showing a chip package replacing structure of one form which may be suitably incorporated in the invention.

Thus, it will be noted that the chip package of the illustrated embodiment permits automatic replacement of the chip package to be facilitated using the engagement recesses on the Referring now to FIG. 24, a chip package replacing structure is shown which may be suitably incorporated in the casing.

In the chip package, replacing structure of FIG. 24, a chip mounting apparatus 100 includes a chip feed section 102, which is provided with a plurality of compartments 270 for storing chip packages 114 therein. The compartments 270 each are provided therein with an expandable means such as a bellowphragm or the like which is expanded when compressed air is fed thereto and shrunk when the air is discharged therefrom, so that the chip package may be detachably arranged in the compartment 270. The chip feed section 102 may be fixedly arranged with respect to the chip mounting apparatus 100.

A storage kit or housing 122 which is arranged in a manner to be spaced at a predetermined distance from the chip feed section 102 and extend in parallel to the chip feed section 102 includes a plurality of compartments 272 for detachably storing chip packages 114 therein. In the illustrated embodiment, the compartments 272 are adapted to be charged with a chip package filled with chips at every two intervals. More particularly, compartments charged with chip-filled chip packages and empty compartments are alternated with each other.

Between the chip feed section 102 and the storage housing 122 is arranged a chip package transfer means 274 which comprises a transfer robot including a reversible arm 276 arranged so as to be reversibly rotated about a central shaft 278 and a pair of chucks 280 provided at each of both ends of the reversible arm 276. The transfer robot 274 is arranged so as to be linearly movable in parallel to the chip feed section 102 and storage housing 122 along a guide rail 282 as indicated at arrows B in FIG. 24, and the reversible arm 276 is arranged so as to be reversibly rotated by an angle of 180 degrees as indicated at arrows R. The chucks 280 mounted on both ends of the reversible arm 276 are arranged so as to be extensible in an axial direction of the arm 276. One of the two chucks 280 at each end of the arm is provided for transferring an emptied chip package and the other is for transfer of a chip package filled with chips. The chucks 280 each are moved along the compartments 270 of the feed section 102 or the compartment 272 of the storage housing 122 due to movement of the transfer robot 274 in the direction of the arrows B, resulting in holding or grasping a chip package in any compartments, as shown in FIGS. 25 and 26.

Figure 25:
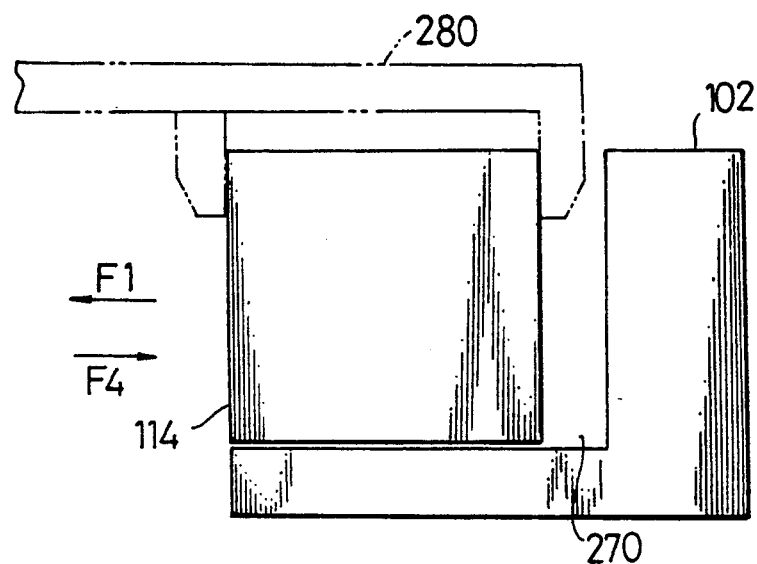
FIG. 25 is a schematic view showing transfer of a chip package between a chip feed section and a chip transfer robot.

Supposing that a chip package 114 in one of the compartments 270 of the chip feed section 102 is emptied of chips, the transfer robot 274 is moved in desired one of the B directions to permit one of the chucks 280 in a pair to be rendered opposite to the emptied chip package and then the chuck is extended to grasp the emptied chip package 114 as shown in FIG. 25. Subsequently, the chuck 280 is contracted in a direction indicated at an arrow F1 in FIG. 25 to remove the emptied chip package 114 from the chip feed section 102. Then, the reversible arm 276 is reversed by 180 degrees and the transfer robot 274 is moved in desired one of the B directions as required, so that the chuck 280 holding the empty chip package is caused to be opposite to desired one of the empty compartments. Thereafter, the chuck 280 is extended in a direction indicated at an arrow F2 and releases the empty chip package, leading to storing of the empty chip package in the compartment as shown in FIG. 26.

Figure 26:
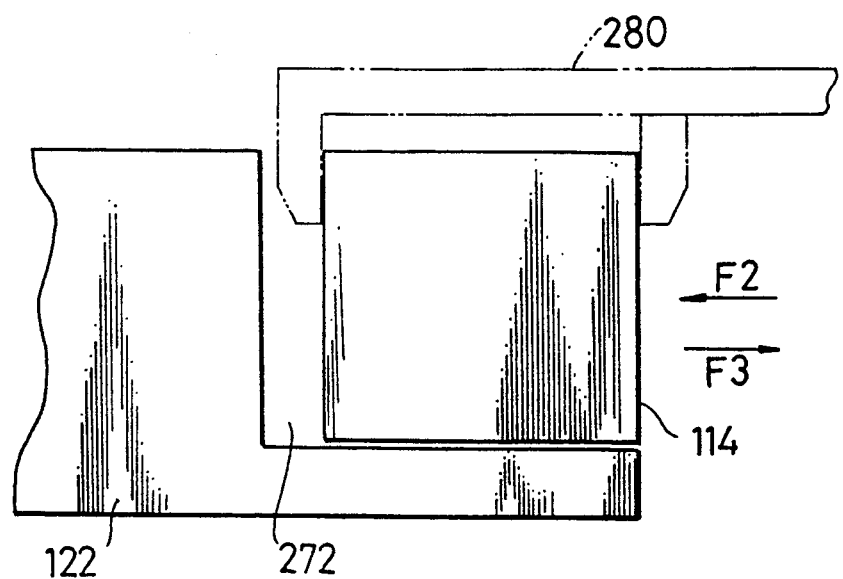
FIG. 26 is a schematic view showing transfer of a chip package between a storage kit or housing and a chip transfer robot.

Then, the other of the chucks 280 in a pair rendered opposite to the compartment having a chip package 114 filled with chips stored therein, if required, by movement of the transfer robot 274 in desired one of B directions is actuated to hold the chip package as shown in FIG. 26. Subsequently, the chuck 280 is contracted to withdraw the chip package 114 from the compartment 122 as indicated at an arrow F3. Thereafter, reverse rotation of the reversible arm 276 by 180 degrees and, if required, movement of the transfer robot 274 in desired one of the B directions carried out cause the chuck 280 to be opposite to any desired one of the compartments 270 of the chip feed section 102, and then extension of the chuck 20 and release of the chip package 114 from the chuck result in the chip package filled with chip being fed to the compartment.

In the illustrated embodiment, the transfer robot 274 is movable in the B directions and the chip feed section 102 and storage housing 122 are ,stationary. Alternatively, the embodiment may be constructed so that the transfer robot is fixed on the central shaft 278 and the chip feed section 102 and storage housing 122 are movable in the B directions. Also, the compartments 272 each having the chip package and the empty compartments are alternated with each other in the storage housing 122. Alternatively, a plurality of the empty compartments may be arranged contiguous to each other. Emptiness in each of the compartments 270 and 272 may be detected by means of a sensor. The number of chucks mounted on each of the distal ends of the reversible arm 276 may be one, or three or more. Further, the reversible arm may be reversed in a horizontal plane or a vertical plane.

Thus, the illustrated embodiment permits the chip packages to be rapidly fed to the chip feed section, so that the chip feed section may feed the chip mounting apparatus with chips continuously, resulting in ensuring continuous running of the chip mounting apparatus.

Figure 27:
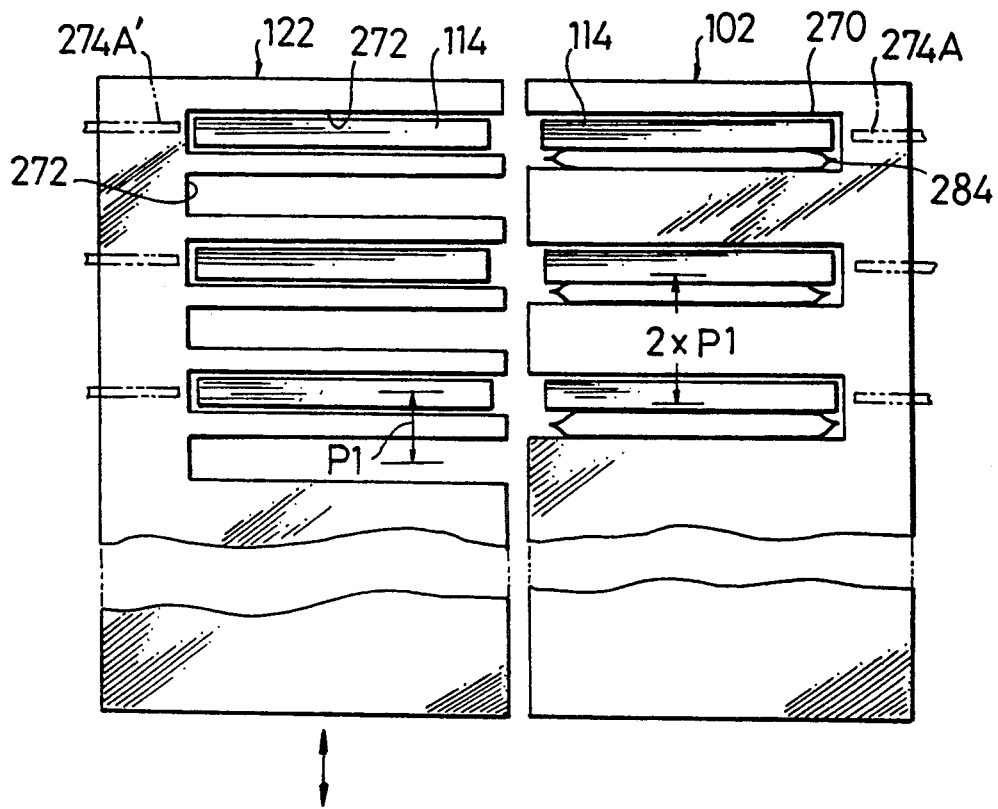
FIG. 27 is a schematic plan view showing a chip package replacing structure of another form which may be suitably incorporated in the present invention.

FIG. 27 shows a chip package replacing structure of another form which may be suitably incorporated in the present invention, which generally includes a chip feed section 102 and a storage kit or housing 122. The chip feed section 102 includes a plurality of compartments 270 in each of which a chip package 114 is received. The compartments 270 each have a bellowphragm 284 arranged therein, which is constructed so as to be expanded when compressed air is fed thereto and shrunk when it is discharged therefrom. This permits the chip package 114 to be detachably received in the compartment 270. More particularly, when the chip package 114 is transferred to the compartment 270, compressed air is fed to the bellowphragm 284 to expand it, to thereby keep the chip package 114 stationary in compartment 270. When the chip package 114 is to be removed from the compartment 270, compressed air is discharged from the bellowphragm 284 to shrink it, to thereby release the chip package 114. The chip feed section is kept fixed with respect to a chip mounting apparatus (not shown).

The storage housing, 122 includes a plurality of compartments 272, and chip packages 114 filled with chips are received in the compartments at every two intervals. Thus, compartments 272 in which chip packages 114 filled with chips are stored and empty compartments 272 are alternated with each other. A positional relationship between the compartments 270 and 272 is so determined that the compartments 272 are arranged so as to be spaced at an interval P1 from each other, whereas the compartments 270 are arranged so as to be spaced at an interval 2×P1 from each other. The storage housing 122 thus constructed may be movable along the chip feed section 102 using a suitable carrier means such as a movable carrier while being kept closely opposite to the chip feed section 102.

Figure 28:
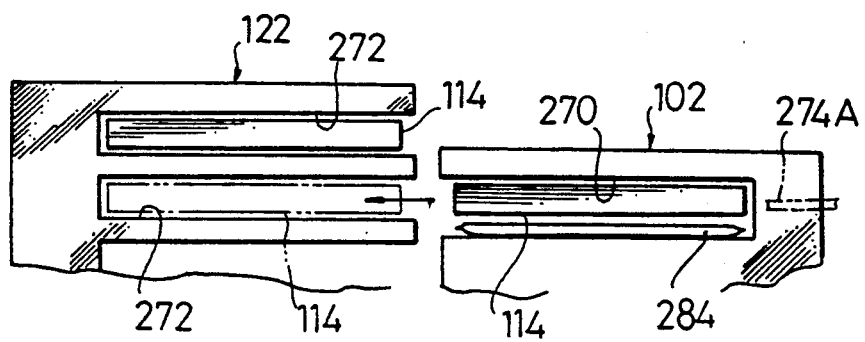
FIG. 28 is a fragmentary plan view showing transfer of a chip package from a transfer of a feed section to a storage housing.
Figure 29:
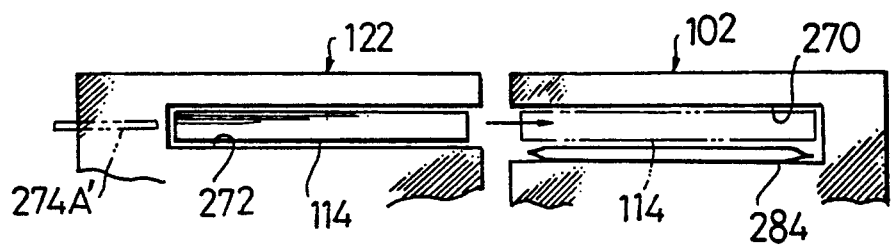
FIG. 29 is a fragmentary plan view showing transfer of a chip package from a storage housing to a chip feed section.

Supposing that one of the compartments 270 of the chip feed section 102 is emptied of chips, the storage housing is moved by the interval P1 through the carrier means, to thereby render the empty compartment 272 of the storage housing 122 opposite to the compartment 270 having the chip package emptied of chips received therein, during which compressed air is discharged from the bellowphragm 284 to shrink it, resulting in the chip package 114 in the compartment 270 being released. Then, an expansion pusher 274A which acts as a transfer means on the side of the chip transfer section 102 is actuated to push out the emptied chip package from the compartment 270 into the empty compartment 272 of the storage housing 122, resulting in the chip package being transferred from the chip feed section 102 to the storage housing 122, as shown in FIG. 28. Subsequently, as shown in FIG. 29, the storage housing is moved by a distance corresponding to, for example, the interval P1 of arrangement of the storage housings 114 with respect to, for example, the emptied compartment 270 of the chip transfer section 102 to render the compartment 272 charged with a chip package filled with chips opposite to the emptied compartment 270, and then an expansion pusher 274A' which is a transfer means on the side of the storage housing 272 is actuated to transfer the chip package 114 from the storage housing 122 to the chip transfer section 102. Thereafter, compressed air is fed to the bellowphragm 284 to expand it, to thereby securely hold the chip package thus transferred in the compartment 270.

Thus, in the chip package replacing structure of the illustrated embodiment, the storage housing 122 is arranged in proximity to the chip feed section 102, so that a space occupied by the structure may be significantly reduced. Also, in the storage housing 122, the empty compartments 272 are alternated with the charged compartments 272, resulting in a stroke of movement of the storage housing 122 being minimized. Emptiness in each of the components 270 and 272 may be detected by means of a sensor.

Figure 30:
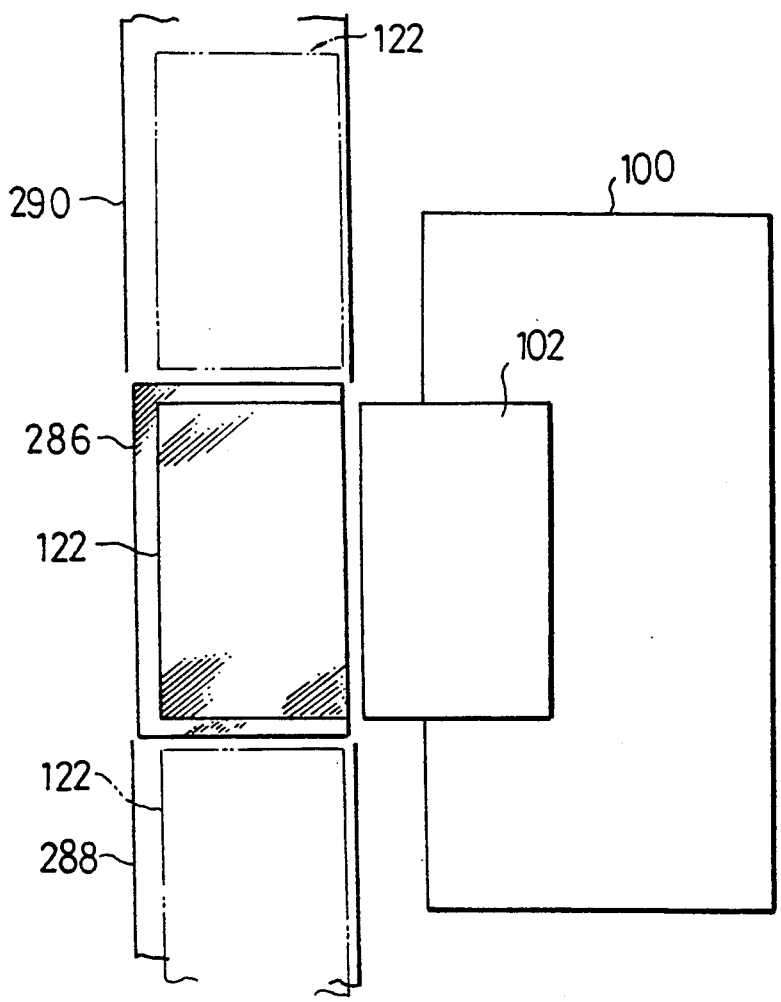
FIG. 30 is a schematic plan view showing a modification of the chip package replacing structure shown in FIG. 27.

FIG. 30 shows a modification of the chip package replacing structure shown in FIG. 27, in which reference numeral 100 designates a chip mounting apparatus. A chip feed section 102 and storage kit or housing 122 may be constructed in substantially the same manner as those in the embodiment shown in FIG. 27. The modification is so constructed that the storage housing 122 is detachably supported on a support 286, an emptied storage housing 122 which has only chip packaged emptied of chips stored therein is fed to a taking-out conveyor 288, and a subsequent storage housing having chip-filled chip packages stored therein is fed to the support 286. The chip package replacing structure of FIG. 30 thus constructed permits replacement of storage housing 122 to be automatically carried out, to thereby be accommodated to change in lot of chips.

In the illustrated embodiment, the compartments charged with the chip package and the empty compartments are alternated with each other in the storage housing. Alternatively, a plurality of the empty compartments may be arranged contiguous to each other.

Thus, it will be noted that the illustrated embodiment permits the chip packages to be rapidly fed to the chip feed section, so that the chip feed section may feed the chip mounting apparatus with chips continuously, resulting in ensuring continuous running of the chip mounting apparatus.

Figure 31:
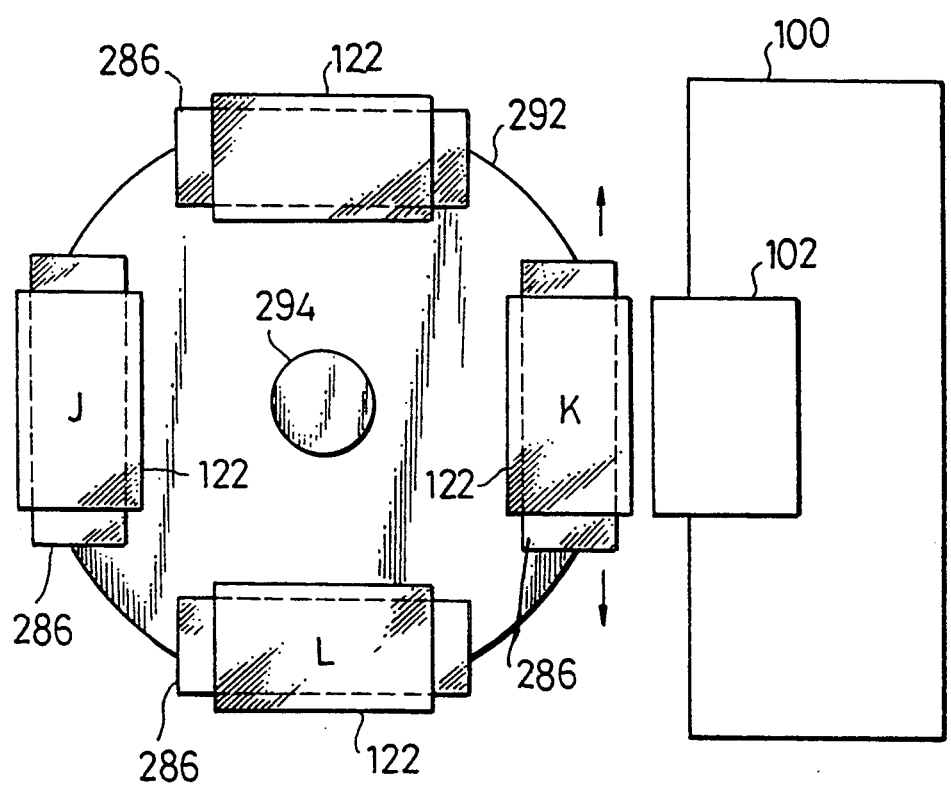
FIG. 31 is a schematic plan view showing a chip package replacing structure form which may be suitably incorporated in the present invention.

FIG. 31 shows a chip package replacing structure of still another form which may be suitably incorporated in the present invention, wherein a chip feed section 102 and storage kit or housing 122 may be constructed in the same manner as shown in FIGS. 27 to 29.

The structure shown in FIG. 31 further includes an intermittent turntable 292 acting as a rotating carrier. The turntable 292 is fixedly mounted on a revolving shaft 294 so as to be rotated by 90 degrees at a time. On the turntable 292 are arranged four storage housing supports 286 at angular intervals of 90 degrees and so as to be slidable in a tangential direction of rotation of the turntable 292. The storage housing 122 is detachably mounted on each of the supports 286. A position J is a chip package feed position at which a storage housing 122 having a number of chip packages each filled with a number of chips stored therein is fed to the support 286 through a feed means (not shown). A position K is a chip package replacing position at which a storage housing 122 is rendered opposite to the chip feed section 102 so as to permit replacement of the chip packages therebetween to be carried out. A position L is a storage housing discharge position at which a storage housing 122 having only chip packages which have been emptied of chips stored therein is discharged through a suitable taking-out means.

In the structure of FIG. 31 constructed as described above, when the support 286 stopped at the position J is fed with a storage housing 122 having chip-charged chip packages stored therein, the intermittent turntable 292 is intermittently rotated to carry the storage housing 122 to the position K, resulting in the storage housing 122 being opposite to the chip feed section 102. At this time, even when the turntable 292 is kept stopped at the position K, the storage housing 122 at the position K may be moved to a desired position along the chip feed section 102 because the support 286 is movable in the tangential direction as described above. Then, replacement of chip packages between the storage housing 122 at the position K and the chip feed section 102 is repeatedly carried out. When the replacement is completed, the intermittent turntable 292 is rotated by 90 degrees to carry the storage housing 122 having only chip packages which have been emptied of chips stored therein from the position K to the storage housing discharge position L, which is then discharged from the support 286.

At the storage housing feed position J, the support is fed with a chip-charged storage housing 122 at every time when the turntable 292 is intermittently rotated by 90 degrees. Consequently, when the emptied storage housing is carried from the position K to the position L, a subsequent chip-charged storage housing is immediately carried to the position K.

Thus, it will be noted the structure of FIG. 31 exhibits the substantially the same advantages as those described above.

Figure 32:
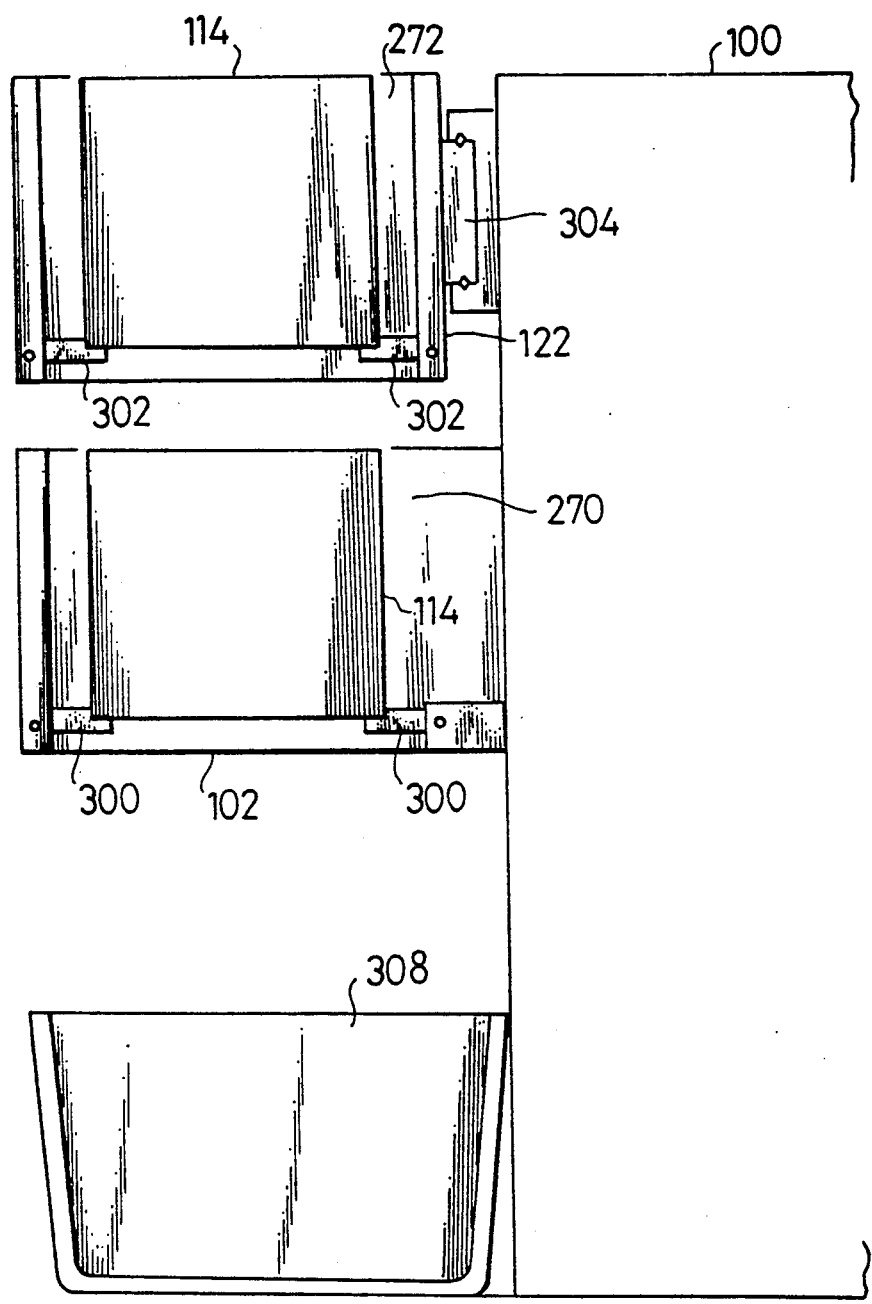
FIG. 32 is a schematic front elevation view showing a chip package replacing structure of still another form which may be suitably incorporated in the present invention.
Figure 33:
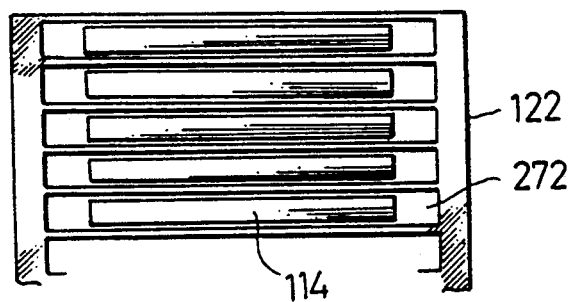
FIG. 33 is a fragmentary plan view showing a storage housing in the structure shown in FIG. 32.
Figure 34:
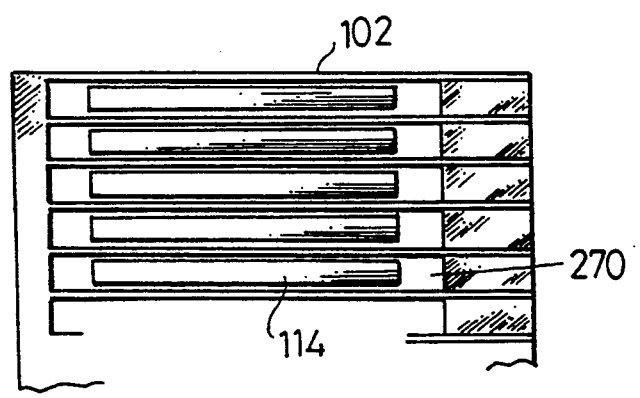
FIG. 34 is a fragmentary plan view showing a chip feed section in the structure shown in FIG. 32.

FIG. 32 shows a chip package replacing structure of yet another form which may be suitably incorporated in the present invention. Reference numeral 102 designates a chip feed section arranged on the side of a chip mounting apparatus 100, which includes a plurality of compartments 270 each adapted to store a chip package 114 therein. The compartments 270 each are provided therein with a bellowphragm (not shown) adapted to be expanded when compressed air is fed thereto and shrunk when the air is discharged therefrom, so that a chip package 114 is detachably placed in the compartment 270. Each of the compartments 270 is provided at a lower portion thereof with an openable support member 300 adapted to support the chip package 114 when it is closed and permit the chip package 114 to drop by gravity when it is open. The chip feeder section 102 thus constructed may be arranged so as to be fixed with respect to the chip mounting apparatus 100.

Above the chip feed section 102 is arranged a storage kit or housing 122 in a manner to be parallel thereto and spaced at a predetermined interval therefrom. The storage housing 122 includes compartments 272 each adapted to detachably store a chip package 114 therein. The compartments 272 each have a chip package charged with chips stored therein. The compartments 272 is provided at a lower portion thereof with an openable support member 302 adapted to support the chip package 114 when it is closed and permit the chip package 114 to drop when it is open. To this end, an actuation means such as a cylinder or the like is provided to actuate the support member 302 between a horizontal position for supporting the chip package and a vertical position for releasing the chip package. The storage housing 122 is mounted through a laterally or horizontally movable slider 304 on the chip mounting apparatus 100.

Figure 36:
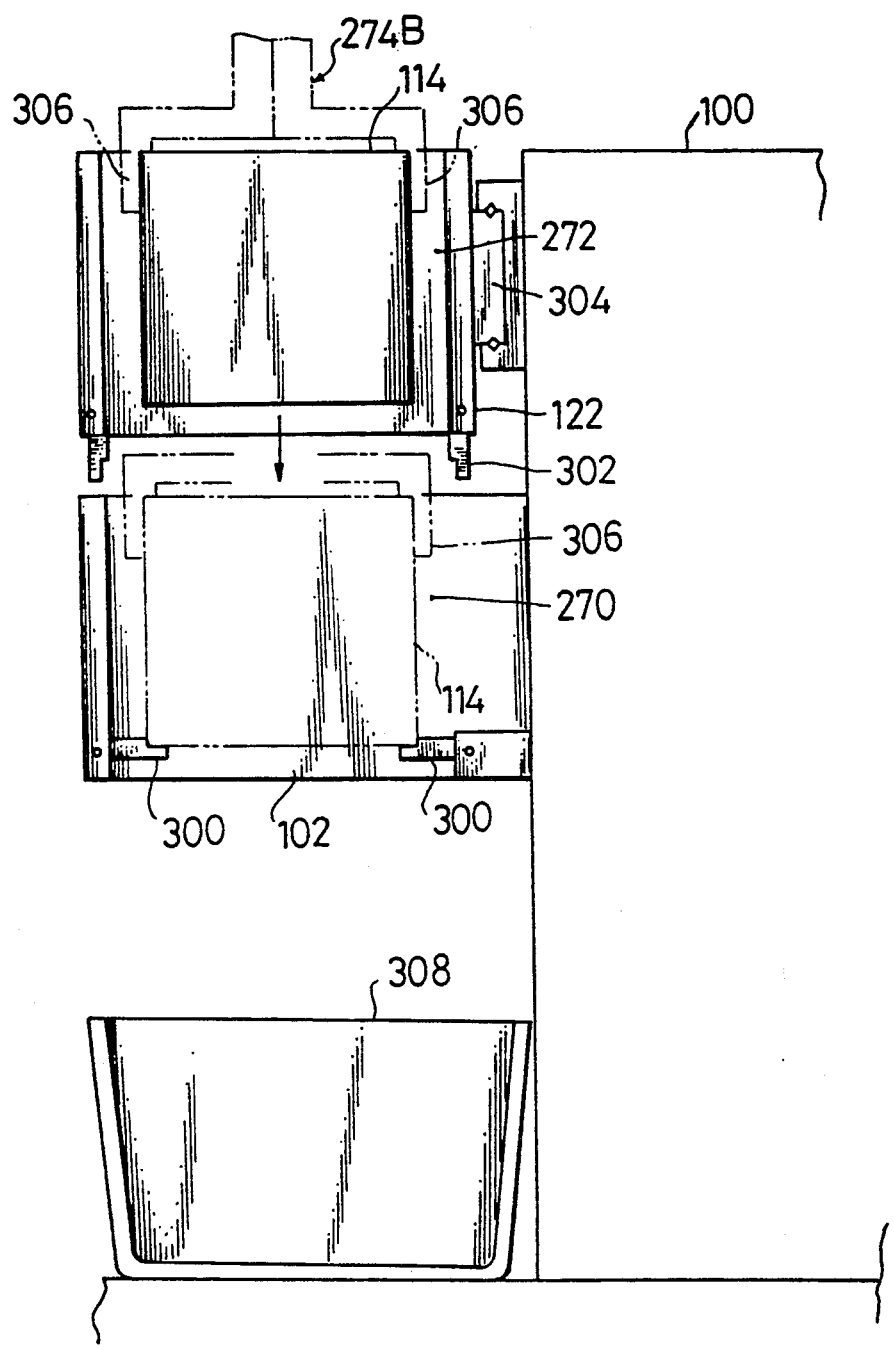
FIG. 36 is a schematic front elevation view showing feeding of a chip package filled with chips to a storage housing in the structure shown in FIG. 32.

Also, the chip package replacing structure of the illustrated embodiment, as shown in FIG. 36, includes a vertical transfer robot which constitutes a vertically movable transfer means 274B for transferring the chip package from the storage housing 122 to the chip feed section 102. The transfer robot 274B is provided at a lower portion thereof with a chuck 306. The robot 274B is constructed in a manner to be horizontally movable in a longitudinal direction of the chip feed section 102 or a direction perpendicular to the sheet of FIG. 36, resulting in transferring the chip package 114 to each of the compartments 270 of the chip feed section 102.

Below the chip feed section 102 is arranged a receptacle 308 for receiving chip packages emptied of chips.

Figure 35:
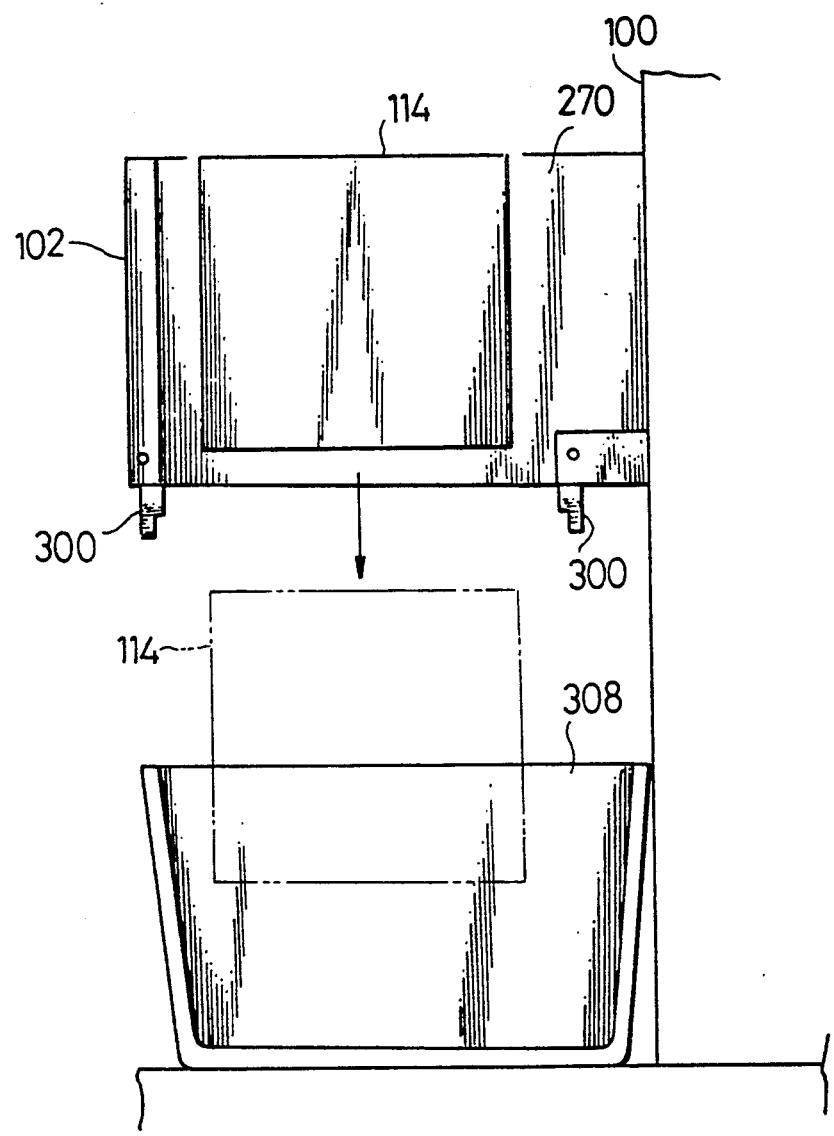
FIG. 35 is a schematic front elevation view showing discharge of a chip package emptied of chips in the structure shown in FIG. 32.

When the chip package 114 in one of the compartments 270 of the chip feed section 102 is emptied of chips, the openable support member 300 of the compartment 270 is rendered open as shown in FIG. 35 to release it from the compartment, so that the emptied chip package is caused to drop onto the receptacle 308 by gravity, resulting in the compartment 270 being emptied of the chip package. The support member 300 is then closed. Then, the chip package in the compartment 272 of the storage housing 122 right above the emptied compartment 270 of the chip feed section 102 is held by the chuck 306 and then the support member 302 is rendered open. Subsequently, the chuck 306 is lowered to place the chip package 114 on the closed support member 300 of the emptied compartment 270 of the chip feed section 102. Thereafter, the chip package 114 is securely held in the compartment 270 through expansion of the bellowphragm.

When the compartment 272 of the storage housing 122 is thus emptied of the chip package 114, the storage housing 122 is horizontally moved to permit a chip package filled with chips to be downward inserted in the emptied compartment 272 by means of the transfer robot 274B as shown in FIG. 36.

The illustrated embodiment causes discharge of the emptied chip package from the chip feed section 102 to the receptacle 308 to be carried out by gravity of the chip package. However, the discharge may be carried out by means of the transfer robot 274B.

As can be seen from the foregoing, the illustrated embodiment is so constructed that the chip package is vertically moved with respect to the chip feed section. Thus, feed of the chip package from the storage housing to the chip feed section can be rapidly and successively accomplished.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An electronic component feeding apparatus for an electronic component mounting apparatus, said mounting apparatus having a mounting head and being adapted to position printed circuit boards and mount electronic components on the printed circuit boards, said feeding apparatus comprising:
   a storage housing for storing a plurality of electronic component storing units for storing sorts of electronic components to be mounted on said printed circuit boards;
   an electronic component feed section arranged at said electronic component mounting apparatus for detachably receiving at least one of said storing units thereon;
   transfer means for transferring said storing units between said feed section and said storage housing; and
   feed means for feeding said electronic components from said storing units to said mounting head for mounting on said printed circuit boards.

2. An apparatus as defined in claim 1, wherein each of said storing units includes a chip feeder module;
   said chip feeder modules each comprising:
   a casing formed with a chip package housing recess for replaceable holding therein a chip package which is formed with a spirally continuous packing path having chips stored therein;
   said chip package being formed at an upper portion thereof with a chip delivery passage;
   said casing also being formed with a feed window for exposing a distal end of said chip delivery passage, a positioning recess formed on a front end surface of said casing, and a holding recess formed on a bottom surface of said casing.

3. An apparatus as defined in claim 2, wherein said chip package housing recess is provided therein with a bellowphragm;
   said bellowphragm being expandable by feeding of air thereto to press one surface of said chip package.

4. An apparatus as defined in claim 2, wherein said chip feeder module further comprises a parts stopper which is adapted to be abutted against a surface of said distal end of said chip delivery passage.

5. An apparatus as defined in claim 2, wherein said casing is formed with engagement recesses to facilitate replacement of said feeder module.

6. An apparatus as defined in claim 2, further comprising means for transferring said chip feeder module to said feed section.

7. An apparatus as defined in claim 6, wherein said means for transferring comprises:
   a module stopper abutted against a front end surface of said chip feeder module;
   a positioning member engaged with said positioning recess of said casing of said chip feeder module; and
   a clamper engaged with said holding recess of said casing;
   said module stopper, positioning member and clamper being arranged on a side of said electronic component feed section.

8. An apparatus as defined in claim 7, wherein said chip feeder module is provided on a base thereof with a projection or a recess so as to extend in a longitudinal direction thereof; and
   said electronic component feed section being provided with a recess or a projection for engagement with said projection or recess of said chip feeder module.

9. An apparatus as defined in claim 1, wherein said storing units include chip packages comprising a casing formed therein with a spirally continuous packing path in which chips are stored;
   said casing being formed on an outside thereof with an engagement recess means to facilitate removing and transferring said chip packages.

10. An apparatus as defined in claim 9, wherein said engagement recess means comprises an engagement recess formed on each of upper and lower surfaces of said casing.

11. An apparatus as defined in claim 1, wherein said electronic components are chips and said storing units comprise chip packages,
   wherein said storage housing further comprises a plurality of compartments in each of which one of said chip packages is stored,
   a number of said compartments each being used for storing of a chip package emptied of chips, and wherein said feed section further comprises
   a chip feed section for detachably holding a chip package;
   said transfer means being adapted for transferring said chip packages between said storage housing and said chip feed section, and said apparatus further including replacing means for replacing said chip packages comprising a reversible arm and chunks mounted on distal ends of said reversible arm.

12. An apparatus as defined in claim 11, wherein said compartments include compartments for chip packages filled with chips and compartments for chip packages emptied of chips which are alternated with each other.

13. An apparatus as defined in claim 1, wherein said electronic components are chips and said storing units comprise chips, stored in chip packages,
   wherein said storage housing further comprises a plurality of compartments each adapted to removably store a chip package therein, a number of said compartments being kept empty, and wherein said feed section further comprises
   a chip feed section for detachably holding a chip package thereon, said transfer means being adapted for transferring said chip packages between said storage housing and said chip feed section, said apparatus further comprising
   carrier means for moving at least one of said storage housing and chip feed section.

14. An apparatus as defined in claim 13, wherein said storage housing is arranged such that compartments each having a chip package stored therein are alternated with empty compartments.

15. An apparatus as defined in claim 1, wherein said electronic components are chips and said storing units comprise chip packages
   and wherein said storage housing further comprises chip packages removably stored therein,
   said apparatus further including replacing means for replacing said chip packages comprising an intermittent rotator adapted to detachably support said storage housing thereon and intermittently rotate to carry said storage housing to a chip package replacing position opposite to said chip feed section.

16. An apparatus as defined in claim 1, wherein said electronic components are chips and said storing units comprise chip packages, and wherein said feed section further comprises a chip feed section on which at least one chip package is detachably mounted;

said storage housing being arranged above said electronic component feed section and having said chip packages removably stored therein, said apparatus further including replacing means for replacing said chip packages comprising a vertically movable transfer means for lowering a chip package in said storage housing to said chip feed section.

17. An apparatus as defined in claim 16, wherein said electronic component feed section and storage housing are arranged so as to be moved relative to each other.

18. An electronic component feeding apparatus for an electronic component mounting apparatus, said mounting apparatus being adapted for positioning printed circuit boards and mounting electronic components on the printed circuit boards, said feeding apparatus comprising:

a storage housing for storing a plurality of electronic components storing units corresponding to sorts of electronic components to be mounted on said printed circuit boards;

an electronic component feed section arranged at said electronic component mounting apparatus for detachably receiving at least one of said storing units thereon;

transfer means for transferring said storing units between said feed section and said storage housing; and feed means for feeding said electronic components from said storing units to a mounting head for mounting on said printed circuit boards, wherein said storage housing comprises:

at least one first compartment in which a chip package is arranged;

at least one second compartment in which a rolled electronic component taping is arranged; and at least one third compartment in which a zigzag electronic component taping is arranged;

said electronic components being fed by said feed means from a predetermined feed height from each of said compartments, said feed heights of each of said compartments being the same.

19. An apparatus as defined in claim 18, wherein said storage housing is arranged so as to be detachable with respect to said electronic component mounting apparatus.

20. An electronic component storage kit comprising:

at least one first compartment in which a chip package is arranged;

at least one second compartment in which a rolled electronic component taping is arranged;

at least one third compartment in which a zigzag electronic component taping is arranged; and feed means for feeding said electronic components from a predetermined feeding height from each of said compartments, said feeding heights of each of said compartments being the same.

21. An electronic component storage kit as defined in claim 20, wherein said storage kit is arranged so as to be detachable with respect to an electronic component mounting apparatus.

22. A chip feeder module comprising:

a casing formed with a chip package housing recess for replaceably holding therein a chip package which is formed with a spirally continuous packing path having chips stored in said packing path;

said chip package being formed at an upper portion thereof with a chip delivery passage;

said casing also being formed with a feed window for exposing a distal end of said chip delivery passage, a positioning recess formed on a front end surface of said casing, and a holding recess formed on a bottom surface of said casing.

23. A chip feeder module as defined in claim 22, wherein said chip package housing recess is provided therein with a bellowphragm;

said bellowphragm being expandable by feeding of air thereto to press one surface of said chip package.

24. A chip feeder module as defined in claim 22, further comprising a parts stopper which is adapted to be abutted against a surface of said distal end of said chip delivery passage.

25. A chip feeder module as defined in claim 22, wherein said casing is formed with engagement recesses to facilitate replacement of said feeder module.

26. A structure for mounting a chip feeder module on a feeder base, wherein the chip feeder module includes a casing formed with a chip package housing recess for replaceably holding therein a chip package which is formed with a spirally continuous packing path and has chips stored in the packing path; the chip package being formed at an upper portion thereof with a chip delivery passage; the casing also being formed with a feed window for exposing a distal end of the chip delivery passage, a positioning recess formed on a front end surface of said casing, and a holding recess formed on a bottom surface of said casing, said structure comprising:

a module stopper abutted against a front end surface of said chip feeder module;

a positioning member engaged with said positioning recess of said casing of said chip feeder module; and a clamper engaged with said engagement recess of said casing;

said module stopper, positioning member and clamper being arranged on a side of said feeder base.

27. A structure as defined in claim 26, wherein said chip feeder module is provided on a base thereof with a projection or a recess so as to extend in a longitudinal direction thereof;

said feeder base is provided with a recess or a projection engaged with said projection or recess of said chip feeder module.

28. A chip package replacing structure for an electronic feed apparatus for an electronic component mounting apparatus, said chip package replacing structure comprising:

a storage housing including a plurality of compartments in each of which a chip package is stored;

a number of said compartments being used for storing chip packages emptied of chips;

a chip feed section for detachably holding a chip package;

transfer means for transferring a chip package between said storage housing and said chip feed section; and replacing means for replacing said chip packages comprising a reversible arm and chucks mounted on distal ends of said reversible arm.

29. A chip package replacing structure as defined in claim 28, wherein said storage housing includes compartments for chip packages filled with chips and compartments for chip packages emptied of chips which are alternated with each other.

30. A chip package replacing structure for an electronic feed apparatus for an electronic component mounting apparatus, said chip package replacing structure comprising:

a storage housing including a plurality of compartments each adapted to removably store a chip package therein, a number of said compartments being kept empty;

a chip feed section for detachably holding a chip package thereon;

a carrier means for moving at least one of said storage housing and chip feed section; and transfer means for transferring a chip package between said storage housing and said chip feed section.

31. A chip package replacing structure as defined in claim 30, wherein said storage housing is so arranged that the compartments each having a chip package stored therein and the empty compartments are alternated with each other.

32. A chip package replacing structure for an electronic feed apparatus for an electronic component mounting apparatus, said chip package replacing structure comprising:

a storage housing having chip packages removably stored therein;

a chip feed section adapted to detachably mount chip packages thereon; and replacing means for replacing said chip packages comprising an intermittent rotator adapted to detachably support said storage housing thereon and intermittently rotate to carry said storage housing to a chip package replacing position to said chip feed section.

33. A chip package replacing structure for an electronic feed apparatus for an electronic component mounting apparatus, said chip package replacing structure comprising:

a chip feed section on which at least one chip package is detachably mounted;

a storage housing arranged above said chip feed section and having chip packages removably stored therein; and replacing means for replacing said chip packages comprising a vertically movable transfer means for lowering a chip package in said storage housing to said chip feed section.

34. A chip package replacing structure as defined in claim 33, wherein said chip feed section and storage housing are arranged so as to be moved relative to each other.

* * * * *

UNITED STATES PATENT AND TRADEMARK OFFICE
CERTIFICATE OF CORRECTION

PATENT NO. : 5,319,846
DATED : June 14, 1994
INVENTOR(S) : Takahashi et al

It is certified that error appears in the above-indentified patent and that said Letters Patent is hereby corrected as shown below:

```
Cover page under inventors: "Honjou" should read --Akita--.
Column 1, line 23, "large sizing" should read --large-
sizing--.
Column 3, line 41 "from ," should read --from--.
Column 4, line 28 "chip for" should read --chip packageor--
Column 4, line 45, "the invention" should read --the present
invention--.
Column 13, line 53, "the" should read --the casing.--.
Column 13, line 56, "casing" should read --present
invention--.
Column 15, line 5, "are ,stationary." should read --are
stationary.--
Column 18, line 59, "4748." should read --274B.--
Column 24, line 13, "position to" should read --position
opposite to--.
```

Signed and Sealed this

Fourth Day of October, 1994

Attest:

Attesting Officer

BRUCE LEHMAN

Commissioner of Patents and Trademarks